US012674246B2

(12) United States Patent
Chua et al.

(10) Patent No.: US 12,674,246 B2
(45) Date of Patent: Jul. 7, 2026

(54) ELECTRODEPOSITION OF METALS USING AN IONICALLY RESISTIVE IONICALLY PERMEABLE ELEMENT OR A SHIELD SPATIALLY TAILORED TO DIE-LEVEL PATTERNS ON A SUBSTRATE

(71) Applicant: Lam Research Corporation, Fremont, CA (US)

(72) Inventors: Lee Peng Chua, Beaverton, OR (US); Gabriel Hay Graham, Portland, OR (US); Bryan L. Buckalew, Tualatin, OR (US); Stephen J. Banik, II, San Mateo, CA (US); Santosh Kumar, Beaverton, OR (US); James Isaac Fortner, Newberg, OR (US); Robert Rash, West Linn, OR (US); Steven T. Mayer, Aurora, OR (US)

(73) Assignee: Lam Research Corporation, Fremont, CA (US)

( * ) Notice: Subject to any disclaimer, the term of this patent is extended or adjusted under 35 U.S.C. 154(b) by 365 days.

(21) Appl. No.: 18/549,426

(22) PCT Filed: Mar. 15, 2022

(86) PCT No.: PCT/US2022/020436
§ 371 (c)(1),
(2) Date: Sep. 7, 2023

(87) PCT Pub. No.: WO2022/197738
PCT Pub. Date: Sep. 22, 2022

(65) Prior Publication Data
US 2024/0141541 A1     May 2, 2024

Related U.S. Application Data

(60) Provisional application No. 63/200,654, filed on Mar. 19, 2021.

(51) Int. Cl.
*C25D 17/00* (2006.01)
*C25D 5/02* (2006.01)
(Continued)

(52) U.S. Cl.
CPC ........... *C25D 17/008* (2013.01); *C25D 5/022* (2013.01); *C25D 5/08* (2013.01); *C25D 5/54* (2013.01); *C25D 17/001* (2013.01); *H10P 14/47* (2026.01)

(58) Field of Classification Search
CPC ........ C25D 17/008; C25D 5/022; C25D 5/08; C25D 17/001; H01L 21/2885; H10P 14/47
See application file for complete search history.

(56) References Cited

U.S. PATENT DOCUMENTS 6,027,631 A     2/2000  Broadbent
6,413,388 B1    7/2002  Uzoh et al.
(Continued)

FOREIGN PATENT DOCUMENTS

CN     204162822 U     2/2015
CN     103038397 B     5/2016
(Continued)

OTHER PUBLICATIONS

International Preliminary Report on Patentability dated Aug. 10, 2023 in Application No. PCT/US2022/012969.
(Continued)

*Primary Examiner* — Richard A Booth
(74) *Attorney, Agent, or Firm* — Weaver Austin Villeneuve & Sampson LLP

(57) ABSTRACT

An apparatus for electroplating a metal on a semiconductor substrate with high control over plated thickness on a die-level includes an ionically resistive ionically permeable element (e.g., a plate with channels), where the element
(Continued)

allows for flow of ionic current through the element towards the substrate during electroplating, where the element includes a plurality of regions, each region having a pattern of varied local resistance, and where the pattern of varied local resistance repeats in at least two regions. An electroplating method includes providing a semiconductor substrate to an electroplating apparatus having an ionically resistive ionically permeable element or a grid-like shield having a pattern correlating with a pattern of features on the substrate, and plating metal, while the pattern on the substrate remains spatially aligned with the pattern of the element or the grid-like shield for at least a portion of the total electroplating time.

38 Claims, 19 Drawing Sheets

(51) Int. Cl.

| | |
|---|---|
| *C25D 5/08* | (2006.01) |
| *C25D 5/54* | (2006.01) |
| *H10P 14/47* | (2026.01) |

(56) References Cited

U.S. PATENT DOCUMENTS

| | | | | |
|---|---|---|---|---|
| 7,967,969 | B2 * | 6/2011 | Mayer | C25D 17/008 |
| | | | | 205/97 |
| 8,623,193 | B1 * | 1/2014 | Mayer | C25D 17/001 |
| | | | | 205/97 |
| 9,834,852 | B2 | 12/2017 | Mayer et al. | |
| 2001/0050233 | A1 | 12/2001 | Uzoh et al. | |
| 2002/0046942 | A1 | 4/2002 | Hanson et al. | |
| 2010/0032310 | A1 | 2/2010 | Reid et al. | |
| 2013/0137242 | A1 * | 5/2013 | He | C25D 7/123 |
| | | | | 204/229.4 |
| 2013/0327650 | A1 | 12/2013 | Mayer et al. | |
| 2013/0334052 | A1 | 12/2013 | Chua et al. | |
| 2017/0175286 | A1 | 6/2017 | Abraham et al. | |
| 2018/0286660 | A1 | 10/2018 | Kagajwala et al. | |
| 2018/0312991 | A1 | 11/2018 | Graham et al. | |
| 2019/0055665 | A1 | 2/2019 | Banik, II et al. | |
| 2023/0175162 | A1 | 6/2023 | Banik, II et al. | |
| 2024/0076795 | A1 | 3/2024 | Banik, II et al. | |

FOREIGN PATENT DOCUMENTS

| | | | |
|---|---|---|---|
| EP | 0504939 | A2 | 9/1992 |
| JP | 2004131750 | A | 4/2004 |
| KR | 101020078 | B1 | 3/2011 |
| KR | 20130007223 | A | 1/2013 |
| KR | 20130127400 | A | 11/2013 |
| KR | 20140067948 | A | 6/2014 |
| KR | 20210008898 | A | 1/2021 |
| WO | WO-2020123322 | A2 | 6/2020 |
| WO | WO-2022197738 | A1 | 9/2022 |

OTHER PUBLICATIONS

International Preliminary Report on Patentability dated Sep. 28, 2023, in PCT Application No. PCT/US2022/020436.
International Search Report and Written Opinion dated Dec. 6, 2024 in PCT Application No. PCT/US2024/043164.
International Search Report and Written Opinion dated Jul. 5, 2022, in PCT Application No. PCT/US2022/020436.
International Search Report and Written Opinion dated May 17, 2022, in PCT Application No. PCT/US2022/012969.
KR Office Action dated Apr. 27, 2023, in application No. KR10-2016-0057962 with English translation.
KR Office Action dated Dec. 20, 2023 in KR Application No. 10-2016-0057962 with English Translation.
KR Office Action dated Mar. 22, 2022, in Application No. KR1020210084236 with English translation.
KR Office Action dated May 17, 2022, in Application No. KR10-2016-0030112 with English translation.
KR Office Action dated Sep. 14, 2022, in Application No. KR10-2022-0101229 with English translation.
KR Office Action dated Sep. 22, 2021, in application No. KR-10-20210084236 with English translation.
TW Office Action and Search Report dated Aug. 29, 2025 in TW Application No. 111103814, with English Translation.
TW Office Action and Search Report dated Sep. 9, 2025 in TW Application No. 111109796, with English Translation.

* cited by examiner

311 —

313 —

201     205     301     201

407

Post Plating

| Flow field orientation | Chemistry 1 | Chemistry 2 |
|---|---|---|
| Variable orientation | Doming profile | Dished profile |
| One orientation | Tilted "Up" | Tilted "Down" |

700

709

700

700

709

+

709

Cell 1                          Cell 2

ELECTRODEPOSITION OF METALS USING AN IONICALLY RESISTIVE IONICALLY PERMEABLE ELEMENT OR A SHIELD SPATIALLY TAILORED TO DIE-LEVEL PATTERNS ON A SUBSTRATE

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

FIELD OF THE INVENTION

The present disclosure relates generally to a method and apparatus for electroplating a metal layer on a semiconductor wafer. More particularly, the method and apparatus described herein are useful for controlling plating uniformity.

BACKGROUND

In semiconductor device manufacturing, a conductive material, such as copper, is often deposited by electroplating onto a seed layer of metal to fill one or more recessed features on a semiconductor wafer substrate. Electroplating is a method of choice for depositing metal into the vias and trenches of the wafer during damascene processing, and is also used in wafer level packaging (WLP) applications to form pillars and lines of metal on the wafer substrate. Another application of electroplating is filling of Through-Silicon Vias (TSVs), which are relatively large vertical electrical connections used in 3D integrated circuits and 3D packages.

In some electroplating substrates, the seed layer is exposed over the entire surface of the substrate prior to electroplating (typically in damascene and TSV processing), and electrodeposition of metal occurs over the entirety of the substrate. In other electroplating substrates, a portion of the seed layer is covered by a non-conducting mask material, such as by photoresist, while another portion of the seed layer is exposed. In such substrates with partially masked seed layer electroplating occurs only over the exposed portions of the seed layer, while the covered portions of the seed layer are protected from being plated upon. Electroplating on a substrate having a seed layer that is coated with patterned mask material (e.g., photoresist) is referred to as through mask plating and is typically used in WLP applications.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

In one aspect, an electroplating apparatus is provided. In one embodiment the apparatus includes: (a) a plating chamber configured to contain an electrolyte and an anode while electroplating metal onto a semiconductor substrate; (b) a substrate holder configured to hold the semiconductor substrate such that a plating face of the substrate is separated from the anode during electroplating; and (c) an ionically resistive ionically permeable element comprising a substrate-facing surface and an opposing surface, wherein the element allows for flow of ionic current through the element towards the substrate during electroplating, wherein the element comprises a plurality of regions, each region having a pattern of varied local resistance, and wherein the pattern of varied local resistance repeats in at least two regions (i.e., there are at least two regions of the element with the same pattern). In some embodiments each region has a length of at least about 5 mm, and there are at least 5 repeating regions on the element. In some embodiments the ionically resistive ionically permeable element is placed in the chamber such that a distance between the substrate-facing surface of the element and the substrate is about 10 mm or less, such as about 5 mm or less.

In another embodiment, an electroplating apparatus is provided, where the apparatus includes: a plating chamber configured to contain an electrolyte and an anode while electroplating metal onto a semiconductor substrate; a substrate holder configured to hold the semiconductor substrate such that a plating face of the substrate is separated from the anode during electroplating; and a shield positioned within about 10 mm of the plating face of the semiconductor substrate, wherein the shield has a grid-like shape with a plurality of openings, wherein the openings have lengths of 5 mm or more.

In another aspect, an ionically resistive ionically permeable element is provided, wherein the element is configured to allow for flow of ionic current through the element towards the substrate during electroplating, wherein the element comprises a plurality of regions, each region having a pattern of varied local resistance, and wherein the pattern of varied local resistance repeats in at least two regions.

In another aspect an electroplating method is provided. In one embodiment the method includes: (a) providing a semiconductor substrate having a pattern of features into an electroplating apparatus, wherein the electroplating apparatus comprises an ionically resistive ionically permeable element or a grid-like shield having a plurality of openings, wherein the ionically resistive ionically permeable element or the grid-like shield is positioned within about 10 mm of the plating face of the semiconductor substrate, and wherein the ionically resistive ionically permeable element or the grid like shield comprise a pattern correlating to the pattern of features of the semiconductor substrate; (b) registering orientation of the semiconductor substrate with the ionically resistive element or the grid-like shield such that the pattern of the features on the semiconductor substrate and the matching pattern of the ionically resistive element or the grid-like shield are spatially aligned; and (c) electroplating metal onto the semiconductor substrate, while maintaining the semiconductor substrate stationary or spatially aligned relative to the ionically resistive element or the grid-like shield at least during a portion of a total electroplating time.

These and other features and advantages of the present invention will be described in more detail below with reference to the associated drawings.

DETAILED DESCRIPTION

Figure 1A:
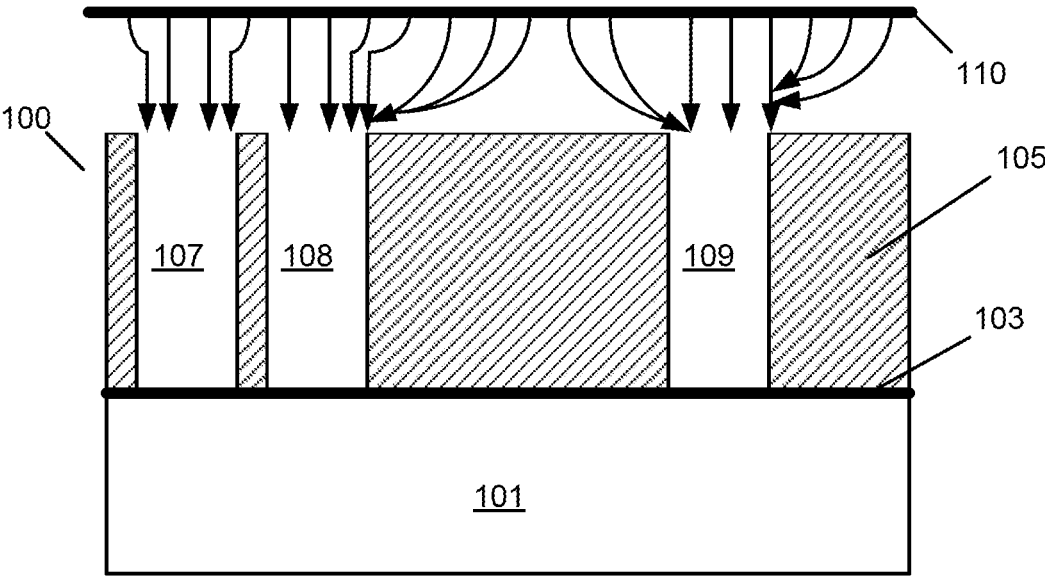
FIG. 1A is a schematic cross-sectional view of a substrate having an isolated feature.

Methods and apparatus for electroplating a metal on a substrate with high level of control over plated thickness are provided. The methods can be used to improve plating uniformity on a die level for multiple dies on the processed substrate. The methods can also be used to modify plating rates to achieve uniform or non-uniform plating as desired. The methods are particularly useful for through mask plating in WLP applications and are illustrated with reference to through-mask plating, but are not limited to these applications. The methods and apparatus employ a tailored ionically resistive ionically permeable element or a tailored shield in close proximity to the substrate to address various plating uniformity challenges, such as within-die non-uniformity. The local resistance pattern of the element or the shield is tailored to match (i.e., correlate with) and to spatially align with a pattern of features on a specific substrate.

The ionically resistive ionically permeable element or the shield is disposed in the electroplating apparatus such that the matching pattern of the element or the shield is substantially spatially aligned with the pattern of features on the substrate at least during a portion of electroplating (e.g., during at least 10% of total plating time). The matching, in some embodiments, is designed such that the regions of the substrate that would experience undesired excessive plating ("hot regions") without correction are spatially aligned with regions of the ionically resistive ionically permeable element or the shield having higher local resistance than other regions of the element or the shield. The regions of the substrate that would experience insufficient plating ("cold regions") without correction, are spatially matched with the regions of the element or the shield that have lower local resistance. It is understood that the methods are particularly useful for improving plating uniformity but can also be employed to plate metal in a tailored profile (not necessarily uniform) if desired.

The provided tailored ionically resistive element or tailored shields are tailored to specific substrates with particular patterns on the substrates spatially aligned with correlating pattern on the element or shield. Thus the element and the shield that improves uniformity for a substrate with one pattern would not be expected to be beneficial for a substrate with a different pattern.

Embodiments are described generally where the substrate is a semiconductor wafer, however the invention is not so limited. The terms "semiconductor wafer" and "semiconductor substrate" are used herein interchangeably and refer to a workpiece that contains semiconductor material, such as silicon, anywhere within the workpiece. Typically the semiconductor material in the semiconductor substrate is covered with one or more layers of other materials (e.g., dielectric and conductive layers). The substrates used for electroplating include a conductive seed layer which is exposed at least at some positions on the surface of the substrate. The seed layer is typically a layer of metal, and may be, for example, a copper layer (including pure copper and its alloys), a nickel layer (including NiB and NiP layers), a ruthenium layer, etc. The substrate typically has a number of recessed features on its surface that are filled during the electroplating process. Examples of metals that can be electroplated using provided methods include, without limitation, copper, silver, tin, indium, chromium, a tin-lead composition, a tin-silver composition, nickel, cobalt, nickel and/or cobalt alloys with each other and with tungsten, a tin-copper composition, a tin-silver-copper composition, gold, palladium, and various alloys which include these metals and compositions.

The term "about" when used with reference to numerical values refers to a ±10% variation in the numerical value.

The term "repeating pattern" encompasses embodiments where the pattern is repeated qualitatively and embodiments where the pattern is repeated both qualitatively and quantitatively. For example, in a qualitative repeat, two or more regions may have the same qualitative pattern of less resistive/more resistive/less resistive areas without necessarily having same resistance or dimensions. In a repeat that is both qualitative and quantitative the two regions not only have the same pattern qualitatively, but also match the values of local resistance and dimensions (e.g., sizes of low resistance portion and high resistance portion of a repeating region). In some embodiments the repeat is matched in dimensions (has same areas of low resistance and high resistance portions in each of repeating regions) but the values of resistance are not exactly the same.

Uniformity in Through Mask Plating

When through-mask electroplating is performed, the semiconductor substrate having a plurality of through-mask features (recessed features or metal bumps) is placed into an electroplating vessel containing an electrolyte and an anode, and the substrate is cathodically biased via electrical contacts made to the conductive seed layer that underlies the non-conductive mask (e.g., photoresist) layer. The through mask features of different diameters can be disposed on the same substrate. Further some of the features may be packed close together (dense area) and others may be more spaced out (isolated area). These disparities may lead to plating non-uniformity, with plating in isolated features occurring at a higher rate than in dense features leading to excessive plating in the features of isolated areas.

Substrates with a significant variability in the feature density, such as dense regions of features with other regions of largely isolated features, and substrates with features having a range of different widths, particularly benefit from provided methods because in these substrates variability in metal thickness distribution after electroplating is exacerbated due to variability of ionic current distribution during electroplating.

Figure 1B:
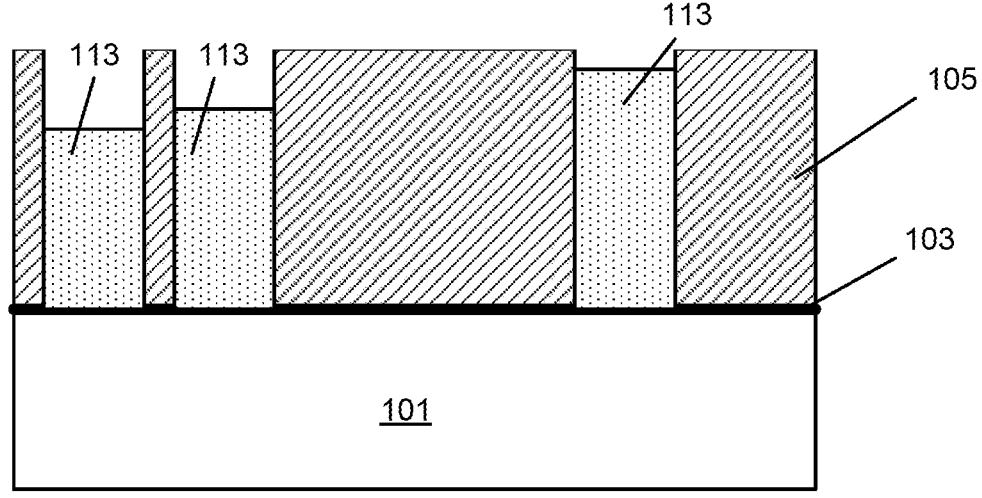
FIG. 1B is a schematic cross-sectional view of the substrate having the isolated feature after electroplating.

FIGS. 1A-1B illustrate this problem for a substrate having an isolated feature and provide an example of a process flow illustrating one type of non-uniformity that can be encountered in through mask electroplating. FIGS. 1A-1B show schematic cross-sectional presentations of a portion of a semiconductor substrate undergoing processing. FIG. 1A illustrates a cross-sectional view of a portion of one such substrate 100, where the substrate includes layer 101 (e.g., a dielectric layer, such as silicon oxide), having a conductive seed layer 103, such as a copper layer, disposed thereon. It is understood that layer 101 may reside over one or more other layers (not shown), which may include adhesion or "stick" layers (Ta, TaN, W, WN, Ti, TiN, TiW, etc.), and semiconductor material, such as Si, Ge, SiGe, etc. A patterned non-conductive mask layer 105 (e.g., photoresist) resides on the seed layer 103, and has a plurality of recessed features formed in the mask such the conductive seed layer material is exposed at the bottom portions of the recessed features. These features are referred to as through mask recessed features. FIG. 1A shows two recessed features 107 and 108 that are disposed proximate each other and an isolated recessed feature 109 at a greater distance from the closest recess 108. The substrate shown in FIG. 1A can be obtained by providing a semiconductor substrate having an exposed layer 101 (e.g., a dielectric layer); depositing a conductive layer over the exposed layer by any suitable method (e.g., a conductive copper seed layer can be deposited by PVD); depositing a mask layer over the seed layer (e.g., spin-coating a photoresist mask), and patterning the mask using, for example, a photolithographic technique, to define the through mask recessed features 107, 108, and 109. The dimensions of the recessed features will vary depending on an application, and typically have widths of between about 5-250 μm, and aspect ratios of between about 1:2-15:1.

Next, metal is electroplated into the recessed features to fill the recessed features (partially, completely, or overfilled, where plating with overfill is sometimes referred to as "mushroom" plating). Because the conductive seed layer material connects all of the features with a relatively small resistance to current flow relative to the resistance of the electrolyte (thereby achieving appropriately a constant potential at the bottom portions of each and all of the recessed features), and because isolated features are more exposed to the 3-dimensional electrolyte environment, isolated features present a lower resistance to the passage of current in the electrolyte, and therefore the isolated recessed features (such as recess 109) tend to be the location of higher ionic current and electrodeposition relative to regions of denser recessed features 107 and 108. This effect, referred to as the "primary current distribution loading effect", is schematically shown in FIG. 1A. During electroplating, the substrate 100 is cathodically biased via the seed layer 103 that is exposed at the side of the wafer and is electrically connected to a power supply. The substrate is placed into an electroplating cell opposite an anode 110, and the working surface of the substrate is immersed into the electrolyte containing ions of the metal to be plated, and, optionally, an acid increasing the electrolyte conductivity.

The plating solution typically will contain plating additives which modify the surface reaction kinetics and often are useful in improving the current distribution (feature shape and thickness distribution) relative to that which occurs in their absence (improved relative to the primary or electrolyte-resistance-driven current distribution). The distribution of the ionic current field is schematically shown by arrows in FIG. 1A. Because the mask layer 105 is not conductive, the ionic current distribution will be primarily governed by the distribution of the exposed portions of the conductive seed layer 103 on the surface of the substrate.

As a result of non-uniform ionic current distribution, the recessed features will be filled differently, as shown in FIG. 1B, which shows the features filled with metal 113. In the depicted example the fastest feature fill occurs in the isolated feature 119 and the slowest fill in feature 117.

Provided methods can mitigate plating non-uniformity between isolated and dense regions of through-mask features, but are not limited to addressing this type of non-uniformity, and can be used in any application where excessive plating rate needs to be reduced at specific locations on the substrate.

The wafer typically contains multiple dies, where each die has the same layout of features (e.g., dense areas and isolated areas). WLP interconnects, namely solder bumps, Cu or Ni pillars usually capped with solder, and redistribution lines (RDL), are typically formed by through resist plating which is inherently not uniform and conforms to the die design layout. This is related to plateable open area density variations across the die stemming from chip performance and reliability design rules: some die regions with bumps more tightly packed together (smaller pitch), and in some cases, some regions employ smaller diameter bumps to further increase bump count IO. In addition, die streets (non-plateable empty spacing between dies) present themselves as lower area density from a plating perspective, and hence it is often typical to observe die edges regions plate locally thicker (hot areas).

In some cases, final uniform bump height (BH) can require non uniform plating rates to different subregions of the die. Examples include cases of multiple opening dimensions that results in varying heights after later solder reflow processing step. This is related to the fact that the reflow process alters the incoming as plated solder mostly cylindrical geometry into a hemispherical cap with a different final BH. The magnitude of this post reflow BH modification is a function of the diameter and hence original opening dimensions. Another example is a die design that employs dedicated multifunction bumps, i.e. live IO, thermal, power, in which the bump formation initiates from different depths but is still desired to have the same final height from a fixed plane reference. Typically, the live and power bumps are below the passivation layer (typically polyimide (PI) or polybenzoxazole (PBO), while the thermal bumps initiate atop the passivation layer. The passivation layer thickness can be in the order of 1 to 10 µm, with 3 to 7 µm being most typical.

Provided methods are capable of producing Die level High Fidelity Tailored Source (DHFTS) current distribution, sufficiently near the substrate to produce desired final metallization height uniformity at a die level throughout the entire wafer. The DHFTS profile complements the substrate die level non-uniformity, and as such is templated into a fine (largely) repeating pattern onto DHFTS element. The DHFTS plating process in some embodiments is one in which the templated DHFTS element remains in sync to the wafer maintaining the high fidelity matching at least during a portion of electroplating. For example, in some embodiments both the wafer and the DHFTS element remain stationary in a matched alignment during plating. In another embodiment the DHFTS element and the wafer are rotated in sync while maintaining the matched configuration.

It is important to note that the optimal local plating rate at the different sub-regions of the die, may not necessarily be the same. In some cases, such as mix CD solder reflow effects, and/or multilayer bumping, some regions of the die will benefit from higher/lower plating rate to produce varying thickness to have a better good bump height uniformity. As such, the tailored source current is designed such that it provides a desired plating rate at specific location, and not necessarily identical plating rates throughout the die.

According to provided embodiments, two types of DHFTS elements are provided: an ionically resistive ionically permeable element ("element") and a grid-like shield ("shield"). Both the element and the shield are manufactured such that they match a particular type of substrate with a specific die distribution, and a specific within-die pattern. The ionically resistive ionically permeable element is also sometimes referred to as High Resistance Virtual Anode (HRVA).

Ionically Resistive Ionically Permeable Element

The ionically resistive ionically permeable element (also referred to as "the element") is a component of an electroplating apparatus that provides an additional resistance on the path of ionic current towards the cathodically biased wafer substrate, and that allows for movement of ions through the element towards the substrate during electroplating.

In some embodiments the element is a porous plate, where the body of the plate is made of a resistive material, and the pores in the resistive material (which may be non-communicating channels or interconnected networks of pores) allow for movement of the ions through the plate towards the cathodically biased substrate. The element has a substrate-facing surface that is in some embodiments planar and parallel to the substrate, and an opposing surface, which does not need to be planar. The element is positioned in close proximity of the substrate, but does not contact the substrate, such that there is an electrolyte-filled gap between the substrate-facing surface of the element and the plating face of the substrate. Preferably the element is positioned within about 25 mm of the substrate, more preferably within about 5 mm of the substrate, such as within about 0.5-2 mm of the substrate during electroplating, where this gap refers to a distance between the plating face of the substrate and the substrate-facing surface of the element. In some embodiments, the gap of between about 0.5-2 mm is particularly advantageous as it provides higher fidelity matching.

The thickness of the element in some embodiments is constant, and in others can be varied, with lower thickness typically leading to lower local resistance. The maximum thickness of the element ranges, in some implementations from about 1 mm to about 100 mm, such as from about 5 mm to about 20 mm.

In some embodiments the element has variable local resistance and/or local porosity. The local resistance and porosity refer to a resistance and porosity of a portion of the element that is sufficiently large to include both channel (pore) and dielectric area. Porosity encompasses both the embodiments of the element with 3-D pore network, and the embodiments with non-communicating channels. The element's resistance refers to ionic resistance across the element that would be observed when the element is filled with electrolyte. The local resistance difference (variation) refers to resistance in a portion of the element that includes at least two adjacent channels being different from resistance in a portion of the element of the same size.

In some embodiments the pores of the element are non-communicating channels (e.g., drilled holes in a dielectric plate that do not interconnect within the plate). These through-holes are distinct from 3-D porous networks, where the channels extend in three dimensions and form interconnecting pore structures. An example of an element with non-communicating through holes is a disc made of an ionically resistive material, such as polyethylene, polypropylene, polyvinylidene difluoride (PVDF), polytetrafluoroethylene, polysulphone, polyvinyl chloride (PVC), polycarbonate, and the like, having between about 1,000-12,000, e.g., between about 3,000-6,000 1-D through-holes. In some implementations the element may further serve an electrolyte flow-shaping function, and may allow for large volume of electrolyte to pass through the channels of its body and provide an impinging flow of electrolyte at the wafer surface. The diameters of the channels should not be larger than the distance between the substrate and the substrate-facing surface of the element, and typically the diameters should not exceed about 2 mm (referring to diameters on the substrate-facing surface of the element). Typically, the diameters of the channels are in a range of between about 0.25-1 mm. The channels may be directed at a 90 degree angle to the substrate-facing surface of the element, or at a different angle of incline.

In other embodiments the pores are three-dimensional networks interconnected within the body of the element and the element is made of a porous dielectric material such as porous silicon carbide, porous glass, and the like.

In one aspect, an ionically resistive ionically permeable element is provided, wherein the element is configured to allow for flow of ionic current through the element towards the substrate during electroplating, where the element includes a plurality of regions, each region having a pattern of varied local resistance, and wherein the pattern of varied local resistance repeats in at least two regions. Each of these regions on the element corresponds to a die on the substrate. In some embodiments each of these regions has a width of at least about 5 mm, such as between about 5-50 mm. For example, if a substrate includes multiple dies, where each die has a pattern of Isolated/Dense/Isolated features the corresponding element will have regions spatially matched to the dies, where each region will have the following local resistance pattern: Resistive/Less Resistive/Resistive. For example in resistive areas each region may include channels with smaller diameter d, and in less resistive areas channels with larger diameter D. In this example the pattern may be ddd/DD/ddd for each region, and the regions are repeated to correspond to multiple dies. For example, the repeat of two regions along one vector may be: ddd/DD/ddd/ddd/DD/ddd.

Figure 2A:
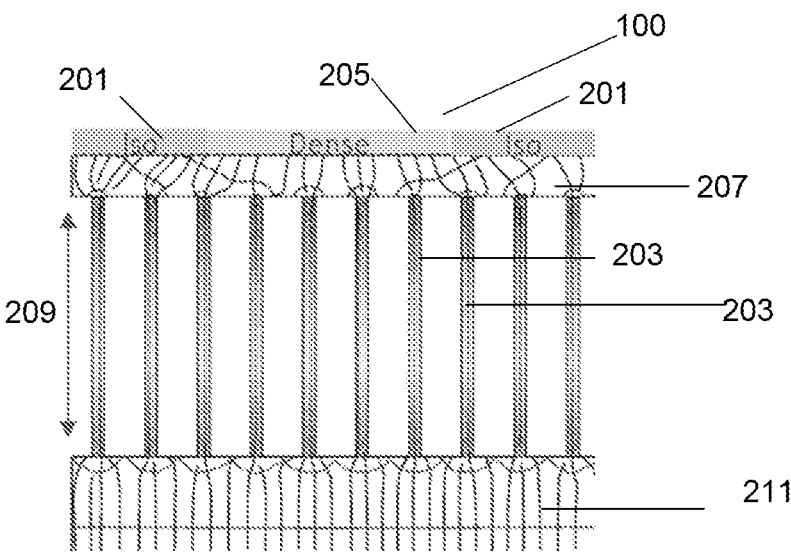
FIG. 2A is an illustration of non-uniformity of current distribution when non-tailored ionically resistive element is used.
Figure 2B:
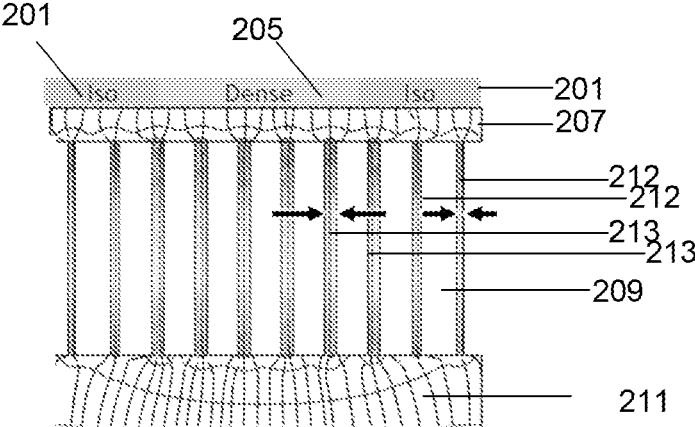
FIG. 2B is an illustration of improved uniformity of current distribution when tailored ionically resistive element is used, according to an embodiment provided herein.

FIG. 2A illustrates a comparative example showing non-uniformity of ionic current distribution for plating on a die having isolated/dense/isolated pattern using a non-tailored element having uniform channel distribution. FIG. 2A shows a portion of a substrate 100 that includes a region of isolated features 201 adjacent to a region of dense features 205, which is adjacent to another region of isolated features 201. An ionically resistive ionically permeable element 209 resides below the substrate 100 and is separated from the substrate 100 by an electrolyte-filled gap 207. The ionically resistive ionically permeable element 209 includes a plurality of channels 203 that fluidically connect the electrolyte-filled region 211 below the element 209 with the electrolyte-filled gap 207 above the element 209. It can be seen that in this comparative example all channels 203 of the ionically resistive ionically permeable element 209 have the same diameter and ionic current passes through the element and is distributed to the die in such a way that greater ionic current is experienced by the isolated regions of the die than the dense region, as schematically shown by ionic current lines in the electrolyte-filled gap 207. FIG. 2B illustrates improved uniformity of current distribution, when an element having region with varied local resistance is used, according to an embodiment provided herein. It can be seen that in this embodiment the isolated features on a die (a region of isolated features 201 and not each individual recess) are spatially matched with high local resistance on the element 209 (in this case areas with channels 212 having smaller diameter—two channels from each side). In contrast the central dense region 205 of the die is spatially matched with the region of the element having channels 213 with a larger diameter than channels 212 (less resistive region). This complementary local resistance variation in the element results in an improvement in current distribution uniformity proximate the substrate, as illustrated, and will result in more uniform plating.

Figure 2C:
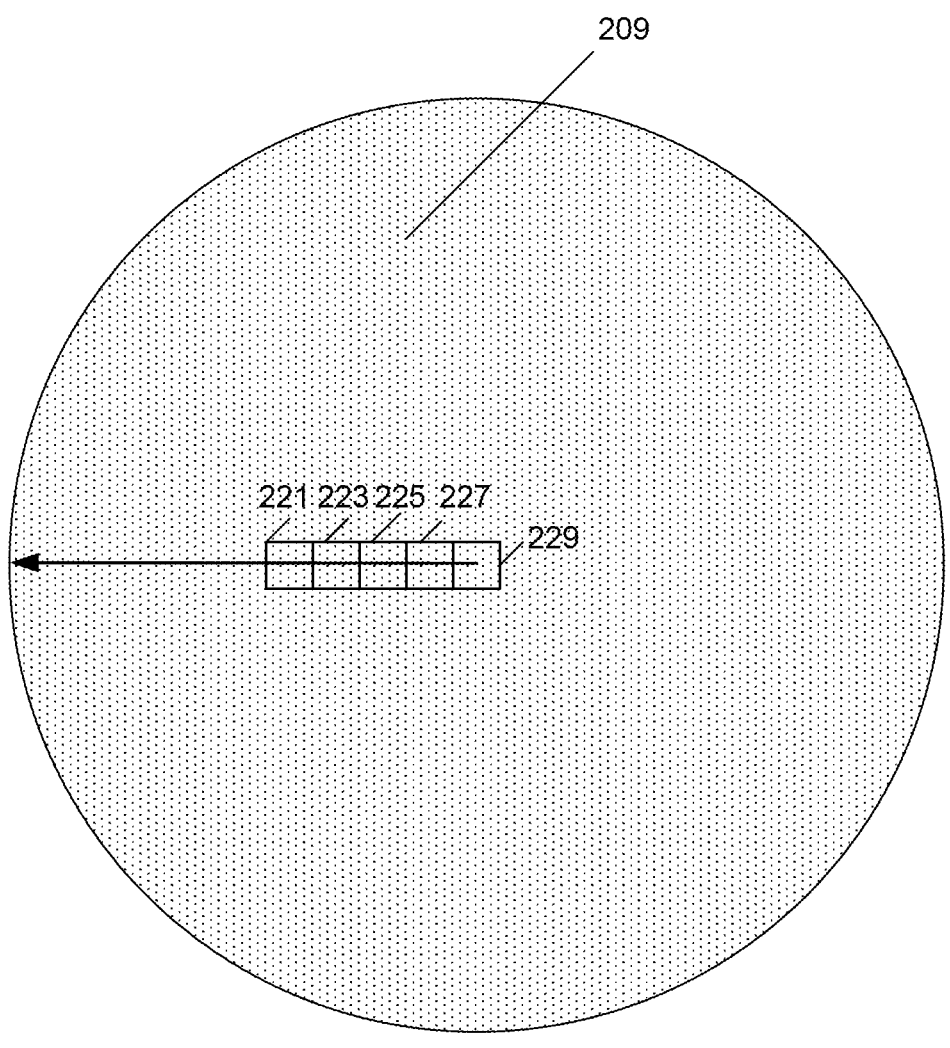
FIG. 2C is a top view of a tailored ionically resistive element having repeating regions of varied local resistance, according to an embodiment provided herein.
Figure 2D:
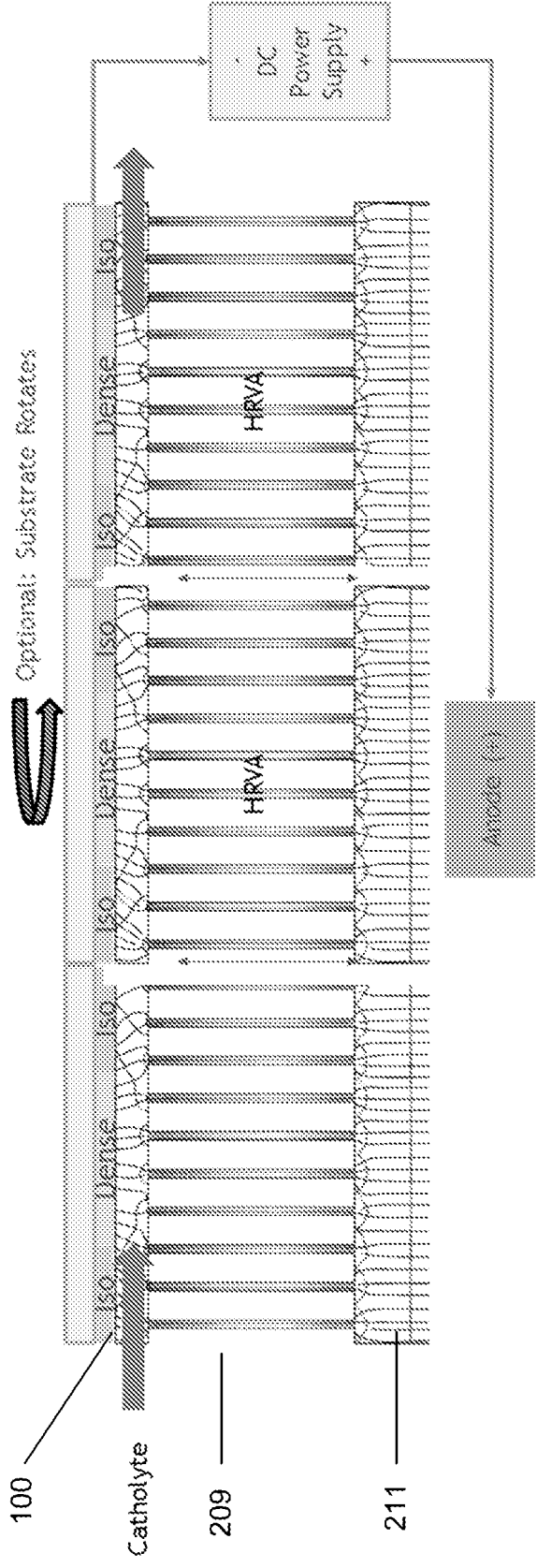
FIG. 2D is a schematic cross-sectional view of a portion of an electroplating apparatus illustrating electroplating on three dies.

It is understood that FIG. 2B does not illustrate plating on the entire wafer and shows only die-level current distribution. Since the wafer typically contains multiple identical dies, the element will contain multiple regions with varied local resistance with the same resistance distribution. In some embodiments the element includes at least five repeating regions with varied local resistance pattern, or at least ten regions. In some embodiments these regions are located along the same vector. FIG. 2C shows a schematic top view of the element 209 that includes at least five regions (regions 221, 223, 225, 227, and 229) having the same pattern of varied local resistance. For example, each of these patterns may be ddDDDDDDdd pattern illustrated in FIG. 2B. The regions with repeating pattern may be adjacent to each other as shown in FIG. 2C or spaced out. FIG. 2D illustrates a portion of a plating apparatus that illustrates plating on three dies. In FIG. 2D the element 209 is shown to have uniform resistance (comparative example). It is illustrated that the current density would be excessive at the edges of each die in this example. If a matching element which spatially complements the pattern of features on the die is used (e.g., with high local resistance spatially mapping to edges of each die), then a more uniform current distribution will be observed.

FIGS. 3A-3L illustrate different ways an ionically resistive ionically permeable element 209 can be configured to complement the pattern of the die. All figures show schematic cross-sectional views of the portion of the element 209 having a pattern of varied local resistance aligned with a pattern on the die. In the depicted example, the pattern on the die is the isolated/dense/isolated feature pattern. The matching pattern of the element is resistive/less resistive/resistive. It is understood that the dies repeat throughout the wafer, and corresponding patterns on the element will also repeat over the long range. FIGS. 3A-3L show a substrate portion in a substrate holder 301, where the substrate portion is a die having a region of dense features 205 between two regions of isolated features 201.

Figure 3A:
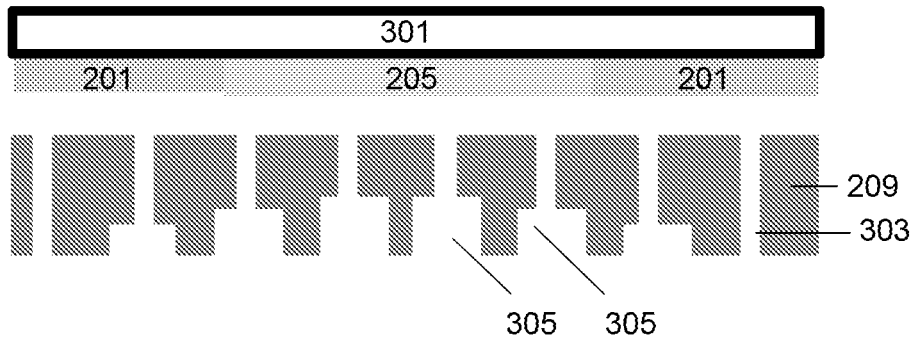
FIG. 3A is a schematic cross-sectional view of a portion of an electroplating apparatus illustrating an ionically resistive element with a region of varied porosity, according to an embodiment provided herein.

FIG. 3A shows an embodiment, where local resistance is varied by varying local porosity of the element, while the thickness of the element does not vary. Specifically, this embodiment utilizes channels 305 of varied diameter to tune the resistance. The element 209 includes channels 305 that have a first small diameter on the substrate-facing surface of the element and a larger second diameter on the opposite side. The resistance is varied by varying the relative length of the first (smaller) diameter. The longer the channel of the first diameter before its diameter is increased to a second diameter, the higher is the resistance. In some embodiments it is preferable to have smaller diameter on the substrate-facing side, because it can reduce backward flow of electrolyte from the substrate down through the element. In other embodiments, the diameter may be larger on the substrate-facing surface of the element. In some embodiments, the first diameter is in a range of between about 0.1-2 mm, and the second diameter is between about 1.2-20 times larger than the first diameter. In specific implementations, the second diameter is about 2-5 times larger than the first diameter. In some embodiments is preferable to gradually vary the length of the holes of first diameter to modulate the resistance as shown in FIG. 3A. In the depicted embodiment the element 209 further includes channels of constant diameter 303.

Figure 3B:
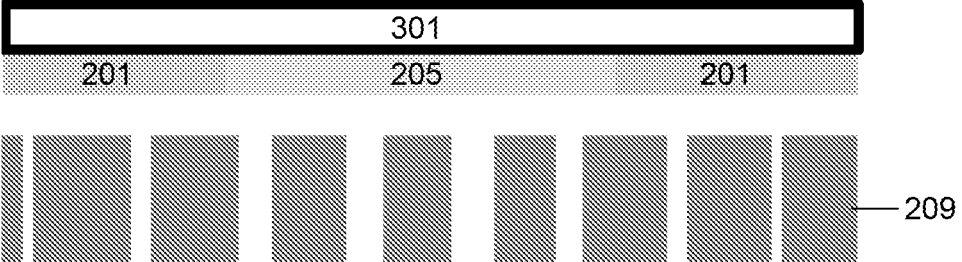
FIG. 3B is a schematic cross-sectional view of a portion of an electroplating apparatus illustrating an ionically resistive element with a region of varied porosity, according to an embodiment provided herein.

FIG. 3B illustrates an embodiment, where local porosity is varied by varying channel diameter, where each channel has a constant length. The element portion aligned with the dense feature region has channels with larger diameter than the portions at the edges, where channels of smaller diameters are employed. In some embodiments the diameters on the element range at between about 1.2-10 times of the smallest diameter.

Figure 3C:
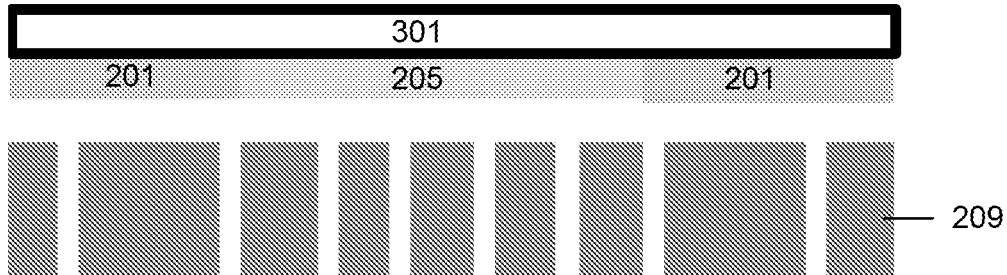
FIG. 3C is a schematic cross-sectional view of a portion of an electroplating apparatus illustrating an ionically resistive element with a region of varied porosity, according to an embodiment provided herein.

FIG. 3C illustrates an embodiment, where local porosity is varied by varying channel position. More dense channel area aligned with the dense feature area of the die is associated with smaller local resistance than the areas with less channels on the sides, which are aligned with isolated feature areas of the die.

Figure 3D:
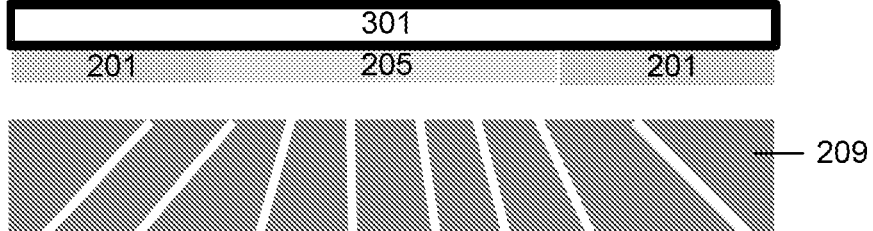
FIG. 3D is a schematic cross-sectional view of a portion of an electroplating apparatus illustrating an ionically resistive element with a region of varied porosity, according to an embodiment provided herein.

FIG. 3D illustrates an embodiment, where local porosity is varied by varying angle of incline of channels. The smaller angle of incline relative to element's surface plane is associated with longer channels and with greater resistance. In the illustrated embodiment the part of the element that is aligned with the dense feature area on the die has channels that are inclined closer to a 90 degree angle to the surface of the element than more inclined channels aligned with the isolated feature areas at the edges of the die.

Figure 3E:
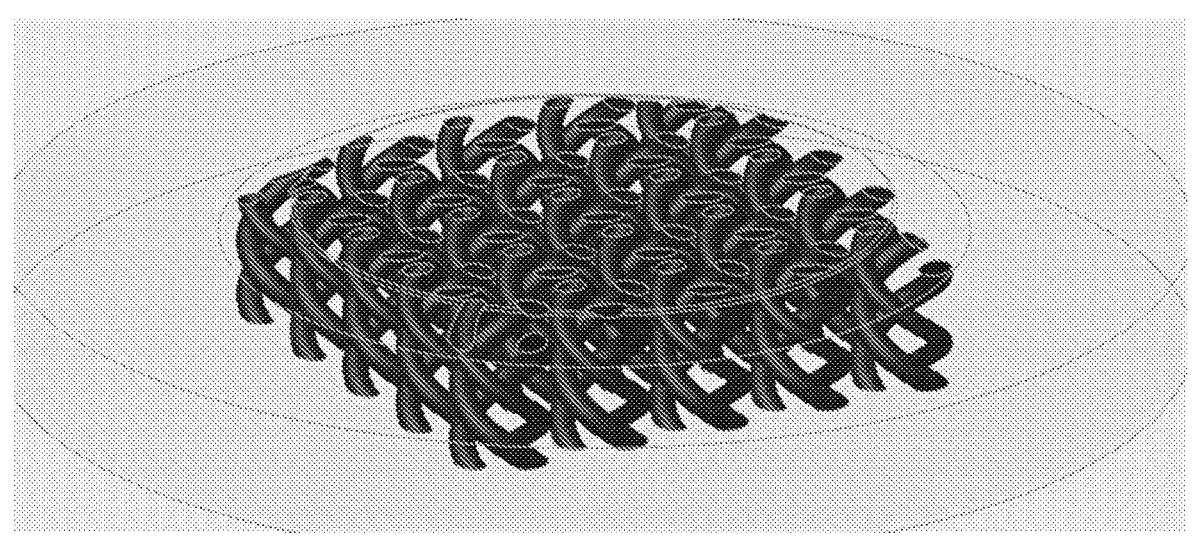
FIG. 3E is a schematic view of an ionically resistive element having helical holes according to an embodiment provided herein.

FIG. 3E illustrates that helical holes can be used for achieving varied local porosity. A portion of an ionically resistive ionically permeable element with helical holes is shown. For example, longer helical holes and/or helical holes with smaller diameters can be used, where resistance should be increased (e.g., aligned with isolated feature regions of the die).

Figure 3F:
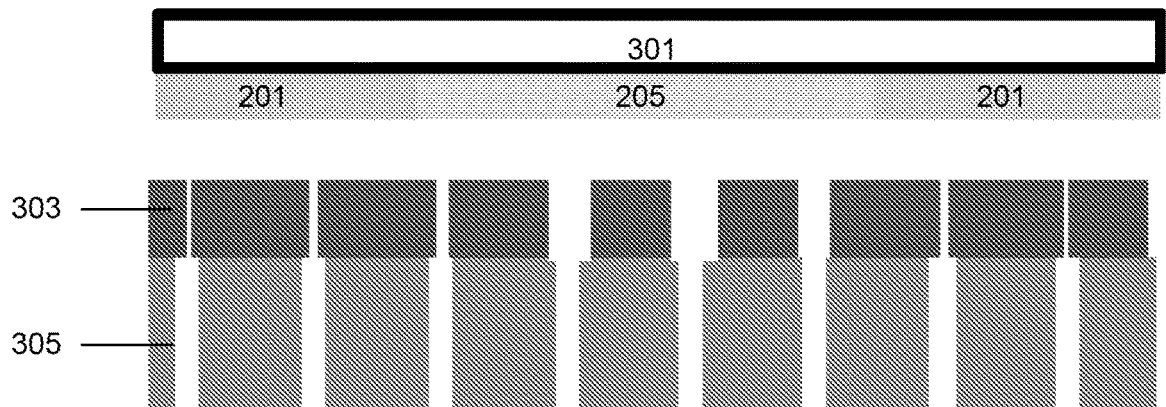
FIG. 3F is a schematic cross-sectional view of a portion of an electroplating apparatus illustrating an ionically resistive element with a region of varied porosity stacked over an ionically resistive element having constant porosity, according to an embodiment provided herein.

FIG. 3F illustrates an embodiment which includes a tailored ionically resistive ionically permeable element 303 stacked over a uniform non-tailored element 305 that has uniform holes. The tailored element can be any of the elements with varied local resistance described herein, where it is aligned with the pattern on the wafer. Specifically, in FIG. 3F the tailored element 303 has larger channel diameters in a region matching with the dense feature region on the die, and smaller channel diameters in regions matching with isolated feature regions on edges of the die.

Figure 3G:
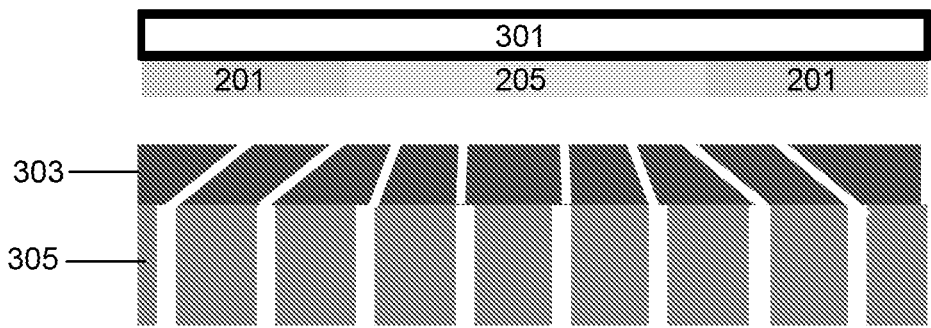
FIG. 3G is a schematic cross-sectional view of a portion of an electroplating apparatus illustrating a tailored ionically resistive element stacked over an ionically resistive element having constant porosity, according to an embodiment provided herein.

FIG. 3G illustrates an embodiment, which includes a tailored ionically resistive ionically permeable element 303 stacked over a uniform non-tailored element 305 that has uniform holes. The tailored element 303 can be any of the elements with varied local resistance described herein, where it is aligned with the pattern on the wafer. Specifically, in FIG. 3G the tailored element has channels with different incline angles, where longer more inclined channels are at the edges aligned with isolated feature regions on edges of the die, and shorter less inclined channels are in the center aligned with the dense feature area of the die.

Figure 3H:
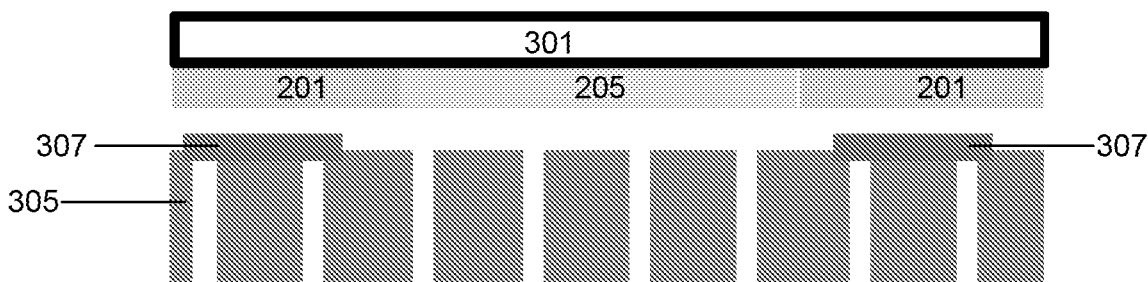
FIG. 3H is a schematic cross-sectional view of a portion of an electroplating apparatus illustrating tailored hole blocking on an ionically resistive element according to an embodiment provided herein.

FIG. 3H illustrates an embodiment, which includes a tailored shield 307 stacked over a uniform non-tailored element 305 that has uniform holes. The tailored shield is configured such that it blocks element's channels only at specific regions where reduction in ionic current is desired (e.g., at regions aligned with isolated feature areas of a die).

Since the wafer has many dies, the shield for dies with isolated areas at the edges, will have a grid-like structure and may be substantially coextensive with the plating face of the substrate.

Figure 3I:
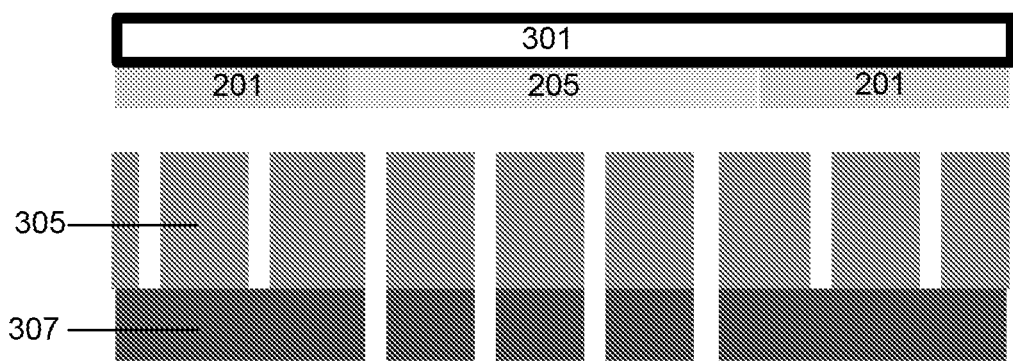
FIG. 3I is a schematic cross-sectional view of a portion of an electroplating apparatus illustrating tailored hole blocking on an ionically resistive element according to an embodiment provided herein.

FIG. 3I illustrates an embodiment, which includes a tailored shield 307 stacked below a uniform non-tailored element 305 that has uniform holes. The tailored shield 307 is configured such that it blocks element's channels only at specific regions where reduction in ionic current is desired (e.g., at regions aligned with isolated feature areas of a die). Since the wafer has many dies, the shield for dies with isolated areas at the edges, will have a grid-like structure and may be substantially coextensive with the plating face of the substrate.

Figure 3J:
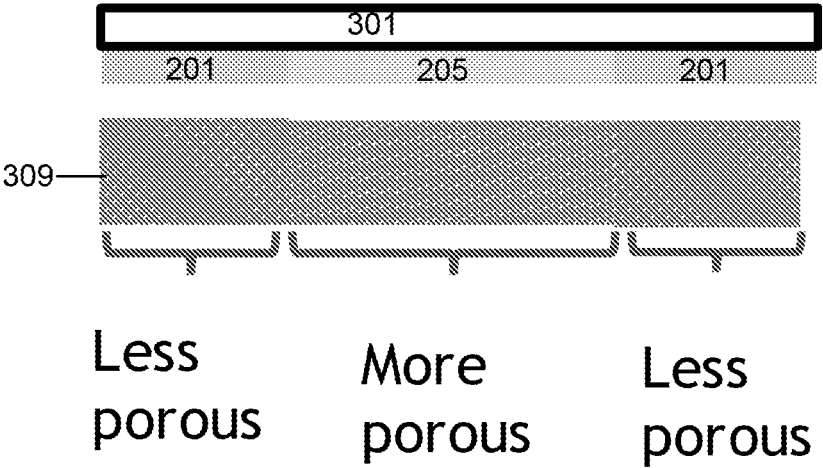
FIG. 3J is a schematic cross-sectional view of a portion of an electroplating apparatus illustrating a tailored ionically resistive element having varied porosity according to an embodiment provided herein.

FIG. 3J illustrates an embodiment where a porous element 309 having a 3-D network of channels (which may be interconnecting) is used. In this illustration the local porosity (and local resistance) varies such that more porous and less resistive portion is aligned with the dense feature area of the die, and less resistive portions with lower porosity are aligned with the isolated areas of the die at the edges.

Figure 3K:
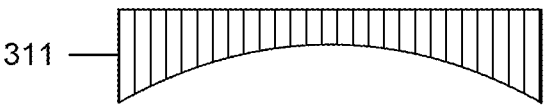
FIG. 3K is a schematic cross-sectional view of a portion of an ionically resistive element having varied thickness according to an embodiment provided herein.

FIG. 3K illustrates an embodiment where a variable-thickness element 313 having straight channels is used. In this illustration the local resistance varies with the element's thickness, where the element is thicker at the edges (and has longer channels at the edges) than in the center (referring to the die-level portion only). Thus, the thinner less resistive portion with short channels is aligned with dense feature portion of the die, and thicker, more resistive portions are aligned with the isolated feature areas. In the depicted embodiment the substrate-facing surface of the element is planar and the opposing surface is not. In other embodiments, the substrate-facing surface of the element is not planar and the opposing surface is planar. In yet other embodiments both surfaces are not planar. The thickness of the element can vary in a wide range. For example, in some embodiments, thickest region of the element may be between about 1.1-50 times thicker than the thinnest region.

Figure 3L:
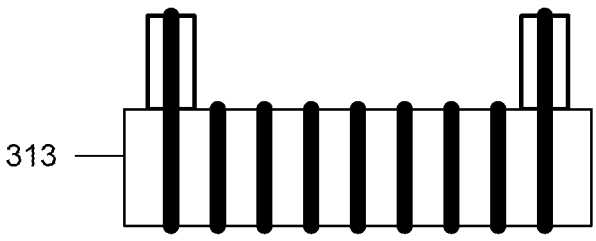
FIG. 3L is a schematic cross-sectional view of a portion of an ionically resistive element having varied thickness according to an embodiment provided herein.

FIG. 3L illustrates another embodiment where a variable-thickness element 315 having straight channels is used. In this illustration the element's portion matched to the die includes several channels that protrude and are therefore longer than other channels resulting in increased resistance. In the depicted embodiment the cylindrical portions supporting the channels protrude from the substrate-facing side of the element, and may be useful for providing additional high-fidelity correction to ionic current in very close proximity of the substrate. The protruding channel in a cylinder can protrude almost up to the substrate surface (e.g., such that there is a 0.5 mm gap between the channel opening and the substrate). In some embodiments the protruding channel in a cylinder protrudes to between about 0.5-2 mm from the substrate-facing surface of the element. In other embodiments, the protruding channel can protrude from the opposing surface of the element.

Figure 8A:
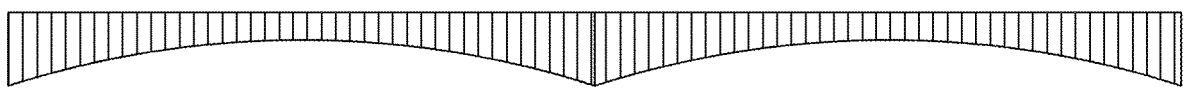
FIGS. 8A-8B provide cross-sectional views of ionically resistive elements, where a region of varied local resistance is repeated two times, according to embodiments provided herein.
Figure 8B:
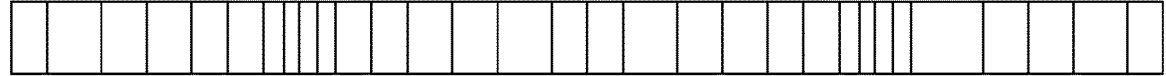

It is understood that the patterns illustrated in FIGS. 3A-3L repeat over long range to match the multiple dies with repeating patterns. In some embodiments each element region illustrated in FIGS. 3A-3L has a length of between about 5-50 mm and its resistance pattern is repeated many times (e.g., at least 5 times or at least 10 times) in a single ionically resistive ionically permeable element to match the patterns on multiple dies. As an example, FIGS. 8A and 8B illustrate cross-sectional views of portions of elements having two regions with varied local resistance pattern that is repeated two times.

Shield Having a Grid-Like Shape.

In one implementation correction of ionic current distribution on a die-level is accomplished by using a shield having a grid-like shape with a plurality of openings, positioned in close proximity of the substrate. Specifically, in order to provide high-fidelity correction the shield should be placed within about 10 mm of the substrate's plating surface, such as within about 5 mm or within about 2 mm of the plating surface. The shield is made from a dielectric material and includes large openings (with lengths of 5 mm or more). The openings map to an area of the substrate, where ionic current should not be shielded (e.g., mapping to dense feature areas on dies), whereas the remaining portions of the shield reduce excessive ionic current proximate "hot areas" (e.g., mapping to isolated feature areas of dies). Because the wafer contains multiple dies with repeating patterns, the shield will generally have shape of a grid. In some embodiments one cell of the grid has a length of between about 5-50 mm, matching the sizes of the dies on the substrate.

It is noted that the shield, similarly to the ionically resistive ionically permeable element, is spatially aligned with the semiconductor substrate, such that pattern of features on the substrate correlates with the patterns on the shield. It is noted that in some embodiments the shield may be engaged in motion such as in vibrating, oscillating, or elliptical motion, e.g., to improve fluidic flow of electrolyte proximate the substrate. In some embodiments the spatial alignment of the shield's features and substrate's features remains within about 2 mm, such as within about 1 mm at least during a portion of the total electroplating time.

Figure 4:
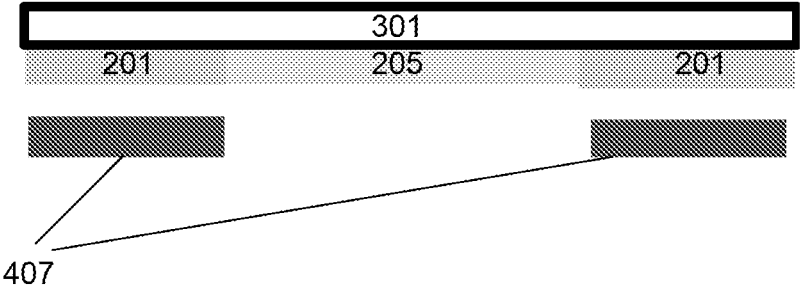
FIG. 4 is a schematic cross-sectional view of a portion of an electroplating apparatus showing a tailored shield according to an embodiment provided herein.

A cross-sectional view of a portion of the shield 407 spatially aligned with the pattern on a substrate's die is illustrated in FIG. 4. It is noted that in this case an ionically resistive ionically permeable element is not used, and the opening in the shield is spatially aligned with the dense feature region on the die, whereas the shield itself is spatially aligned with isolated feature regions of the die.

In some embodiments the grid-like shield includes one or more protrusions extending from the shield in a direction of the substrate that may facilitate the hydrodynamics of the electrolyte proximate the substrate.

In some embodiments the shield is associated with a paddle like motion that moves the electrolyte laterally in a direction substantially parallel to the surface of the substrate.

Wafer-Level and Die-Level Layout

Figure 5A:
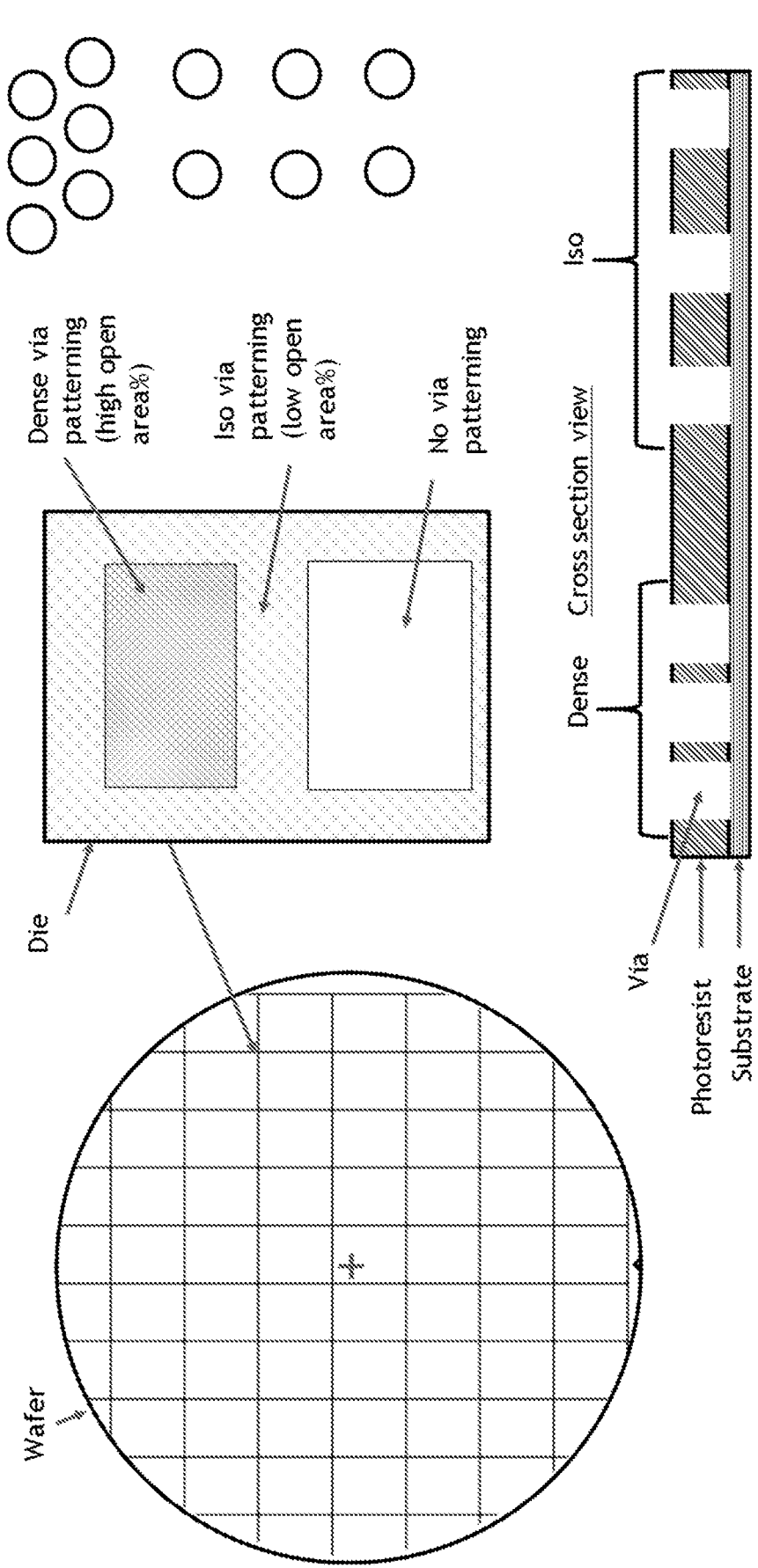
FIG. 5A is a schematic depiction of a wafer having a plurality of rectangular dies having a region of dense and isolated features.
Figure 5B:
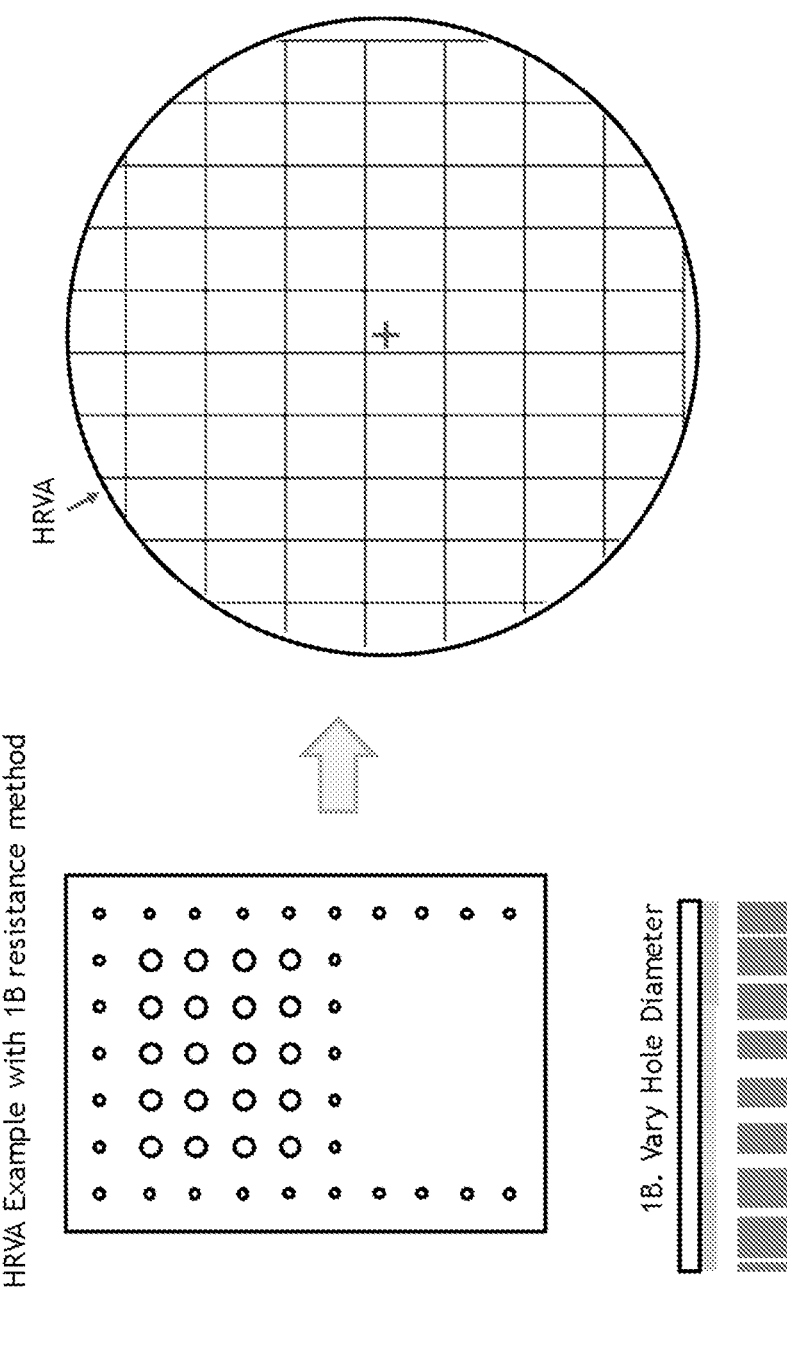
FIG. 5B illustrates a tailored ionically resistive element that is suitable for electroplating metal on a substrate shown in FIG. 5A, according to an embodiment provided herein.
Figure 5B:
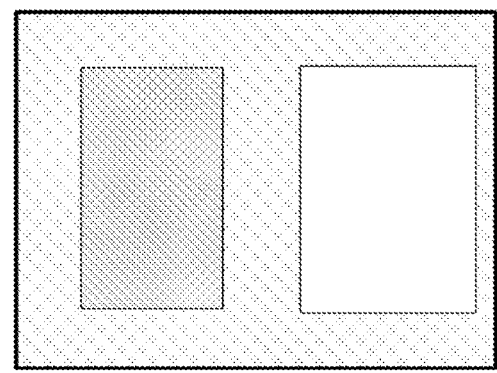

While previous embodiments were primarily illustrated making reference to die-level ionic current correction, it is understood that the wafer has multiple dies, and, consequently, the element will have a plurality of repeating regions having varied local resistance pattern, where the pattern is matched with (i.e., correlated with) the pattern of features on each die. It is noted that the term "pattern of features" does not necessarily refer to individual recessed through-resist features, but more broadly refers to a pattern that may include a regions of features that vary in their ionic current requirements for desired plating profile. As an example, the pattern may include a region of isolated features (which in some embodiments is matched with (correlated with) more resistive area of the element), dense features (which in some embodiments is matched with (correlated with) less resistive area of the element), and blank mask-covered area (which in some embodiments is matched with non-channeled area of the element). This is illustrated in FIG. 5A which shows a wafer having a plurality of rectangular dies, where each die includes an area with isolated features on a periphery of the rectangle, an area with dense features in an upper central portion of the rectangular die, and non-platable photoresist area at the bottom central portion of the rectangular die. FIG. 5B illustrates a tailored ionically resistive ionically permeable element that is suitable for matching the wafer of FIG. 5A. Similarly to the wafer, the element includes a plurality of rectangular regions, which are matched in size to the dies, where each region has varied local resistivity, where the resistivity pattern correlates to the pattern on the die. Specifically, in the illustrated embodiment, each region includes a portion with small-diameter channels at the edges of the region (matching with the isolated feature region of the die), a less-resistive portion with larger-diameter channels (matching with the dense feature region of the die), and a channel-free region (matching the non-plateable portion of the die).

Method

In one aspect, a method of electrodepositing a metal onto a semiconductor substrate is provided. The method starts by providing a semiconductor substrate having a pattern of features into an electroplating apparatus, wherein the electroplating apparatus includes an ionically resistive ionically permeable element or a grid-like shield having a plurality of openings, wherein the ionically resistive ionically permeable element or the grid-like shield is positioned within about 10 mm of the plating face of the semiconductor substrate, and wherein the ionically resistive ionically permeable element or the grid like shield comprises a pattern correlating to the pattern of features of the semiconductor substrate. The substrate may include multiple dies, where each die has a pattern of features (e.g., a region of isolated features and a region of dense features) as described above. The correlating patterns for different feature regions have been described above, but generally the patterns of the element or the shield are designed such as to achieve a desired ionic current profile proximate the substrate, which may be uniform or non-uniform depending on the application. The orientation of the semiconductor substrate with the ionically resistive element or the grid-like shield is registered such that the pattern of the features on the semiconductor substrate and the correlating pattern of the ionically resistive element or the grid-like shield are spatially aligned. For example, an area of the element having increased resistance (e.g., smaller-diameter channels) may be placed directly below the region of isolated features, with possible shifts of preferably not exceeding two mm. It is noted that in some embodiments vibration, or orbital movement of the element or the shield is possible, but preferably such that it does not shift the alignment by more than 2 mm, such as less than about 1 mm. After registration and spatial alignment of patterns, the metal is electroplated onto the semiconductor substrate, while maintaining the semiconductor substrate stationary or spatially aligned (allowing for minimal movement) relative to the ionically resistive element or the grid-like shield at least during a portion of a total electroplating time. In some embodiments the semiconductor substrate and the element or the shield remain stationary or spatially aligned relative to each other during the entirety of the plating time. In other embodiments they remain stationary or spatially aligned during a portion of the time (e.g., at least 10% of time) and are rotated relative to each other for another period of time.

It is noted that in some embodiments an electrolyte is provided to the plating chamber such that it flows laterally in a direction substantially parallel to the plating face of the substrate. In some embodiments the electrolyte flows substantially in one direction entering and exiting the plating chamber at azimuthally opposite positions proximate the perimeter of the substrate.

Figures 6A, 6B:
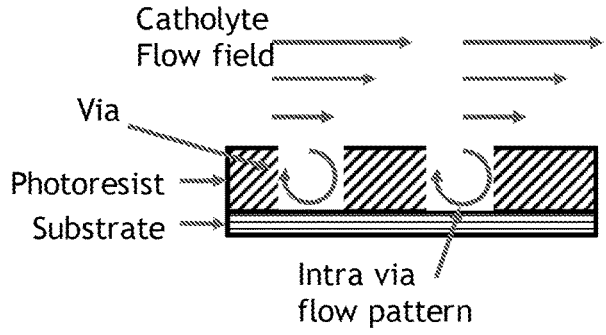
FIG. 6A illustrates a cross-sectional view of a portion of a substrate exposed to a lateral electrolyte flow.
FIG. 6B illustrates non-uniform metal plating that can be observed with lateral electrolyte flow at a stationary substrate.

This unidirectional lateral flow, while being important for electrolyte hydrodynamics within plated features, can lead to within-feature non-uniformity, when the substrate remains stationary. The lateral flow of electrolyte is illustrated in FIG. 6A. The possible non-uniformities that can be observed with lateral flow and stationary substrate are shown in FIG. 6B. While some non-uniformities can be addressed by selecting suitable electrolyte chemistries (e.g., adjusting the concentrations of the metal ions and a leveler), if the substrate remains in one orientation relative to a lateral electrolyte flow (e.g., when the substrate is stationary), the resulting plated metal layer may be tilted up or down within the feature as shown in FIG. 6B. This tilt may lead to solder collapse and is generally undesired.

Figure 7A:
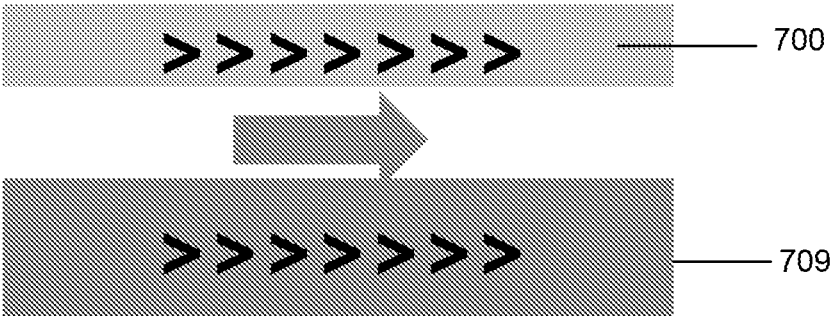
FIG. 7A provides a schematic cross-sectional view of a substrate and an ionically resistive element with a lateral electrolyte flow between the substrate and the element.
Figure 7B:
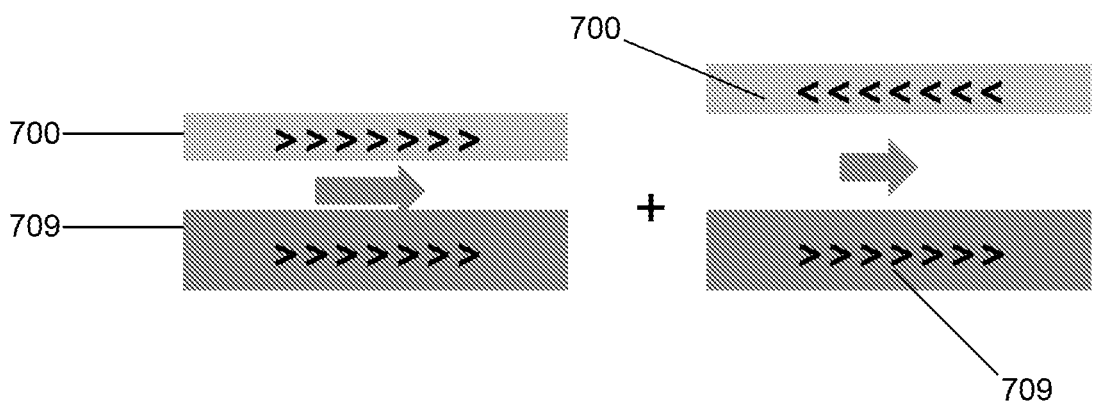
FIGS. 7B-7E schematically illustrate various methods of improving plating uniformity according to embodiments provided herein.

This can be addressed by a variety of methods, which are illustrated in FIGS. 7B-7E. FIG. 7A illustrates a baseline method where the spatially aligned substrate 700 and the element (or shield) 709 remain stationary or spatially aligned relative to each other for the entire plating time. FIG. 7B illustrates a method that can counteract within feature non-uniformity by employing at least two phases. In a first phase the spatially aligned substrate 700 and the element (or the shield) 709 remain stationary or spatially aligned for a fraction of the total electroplating time (e.g., between about 30-90% of the total electroplating time). In the next phase the distance between the substrate and the element (or the shield) is increased and the substrate is rotated (at constant or variable rate) for the remaining time. In some embodiments the lateral electrolyte flow rate is decreased during the second phase.

Figure 7C:
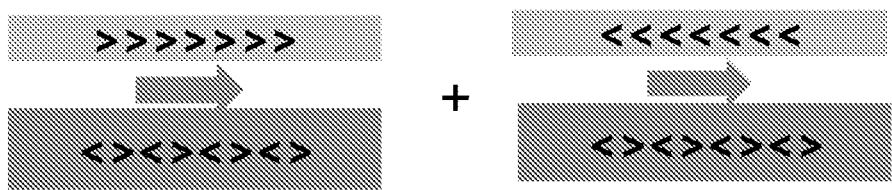

In another embodiment, illustrated in FIG. 7C, if the substrate has type 2 symmetry, the uniformity is improved as follows. In a first phase the substrate is spatially aligned with the element (or the shield) and metal is plated while the substrate and the element (or the shield) are stationary or spatially aligned with each other for a period of time. Next the substrate or the element (or the shield) is rotated by 180 degrees, which is permissible due to substrate symmetry, and more metal is electroplated while the substrate and the element (or the shield) remain stationary relative to each other. In some embodiments the method includes only two phases (50% of time in a first orientation and 50% of time in a rotated orientation). In other embodiments rotation and electroplating are repeated as many times as necessary to achieve improved uniformity.

When the substrate has a four-fold symmetry, electroplating can be performed by first electroplating in a first spatially aligned orientation, rotating the substrate relative to the element (or the shield) by 90 degrees and plating in a second spatially aligned orientation, rotating the substrate relative to the element (or the shield) by 90 degrees and plating in a third spatially aligned orientation, rotating the substrate relative to the element (or the shield) by 90 degrees and plating in a fourth spatially aligned orientation. If desired, 90 degree rotation and plating can be repeated as many times as necessary to achieve improved uniformity.

Figure 7D:
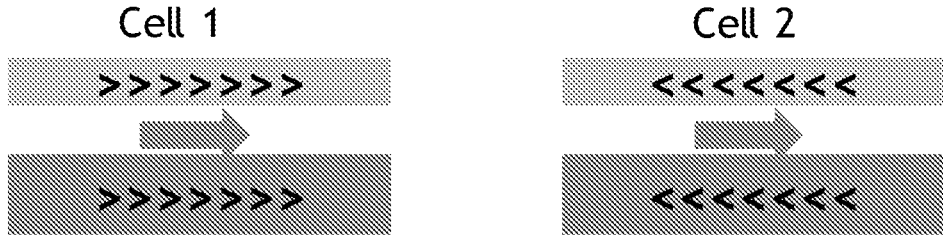
Figure 7E:
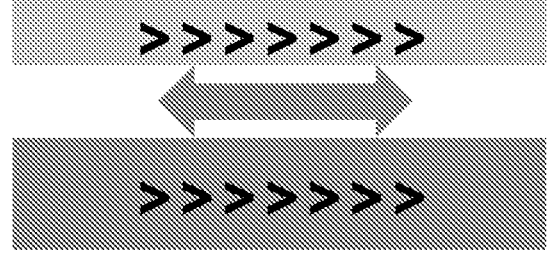

In some embodiments electroplating metal onto the semiconductor substrate, includes a first phase where the semiconductor substrate remains stationary or spatially aligned relative to the ionically resistive ionically permeable element or the grid-like shield during a portion of the total electroplating time in a first electroplating cell; and a second phase which includes electroplating metal onto the semiconductor substrate, such that the semiconductor substrate remains stationary or spatially aligned relative to a second ionically resistive element or a second grid-like shield during a portion of the total electroplating time in a second electroplating cell, wherein both in the first cell and the second cell matching and registration for the semiconductor substrate feature pattern is retained, but wherein a direction of lateral flow in the second cell is different relative to the features of the semiconductor substrate from the first cell. Next, the substrate may be transferred to a third cell for electroplating where spatial alignment in the third cell is retained, but the direction of the lateral electrolyte flow relative to the substrate is different. In some embodiments the substrate may be plated in 2-30 cells (e.g., 4-20 cells), where each cell or some of the cells have different flow directions. FIG. 7D illustrates an embodiment where the substrate is plated in two cells (e.g., 50% of time in each cell), where the electrolyte flow direction in the second cell is opposite to the electrolyte flow direction of the first cell (with respect to features on the substrate).

Further, in some embodiments the substrate is plated in a single cell in a spatially aligned configuration, where the direction of electrolyte flow in the cell is changed during the course of electroplating via the use of pumps, valves or other fluidic devices.

System

The electroplating methods described herein can be implemented in an apparatus having a vessel configured for holding an electrolyte and an anode; and a semiconductor substrate holder configured to hold the semiconductor substrate such that the working surface of the semiconductor substrate is immersed into the electrolyte and is separated from the anode during electroplating. The apparatus includes a power supply and electrical connections configured for negatively biasing the wafer cathode and positively biasing the anode during electroplating. The apparatus further includes a tailored ionically resistive ionically permeable element or tailored shield, as described herein. In some embodiments, the apparatus further includes a mechanism configured to provide a transverse (lateral) flow of the electrolyte contacting the working surface of the substrate in a direction that is substantially parallel to the working surface of the substrate during electroplating. In some embodiments, the apparatus is configured for rotating the substrate at least during a portion of electroplating. The apparatus in some embodiments includes a separator positioned between the anode and the substrate holder, thereby defining an anode chamber and the cathode chamber, where the separator is configured for blocking any particles formed at the anode from crossing the separator and reaching the substrate. The separator is permeable to ionic species of the electrolyte and allows for ionic communication between anode and cathode chambers.

Figure 9:
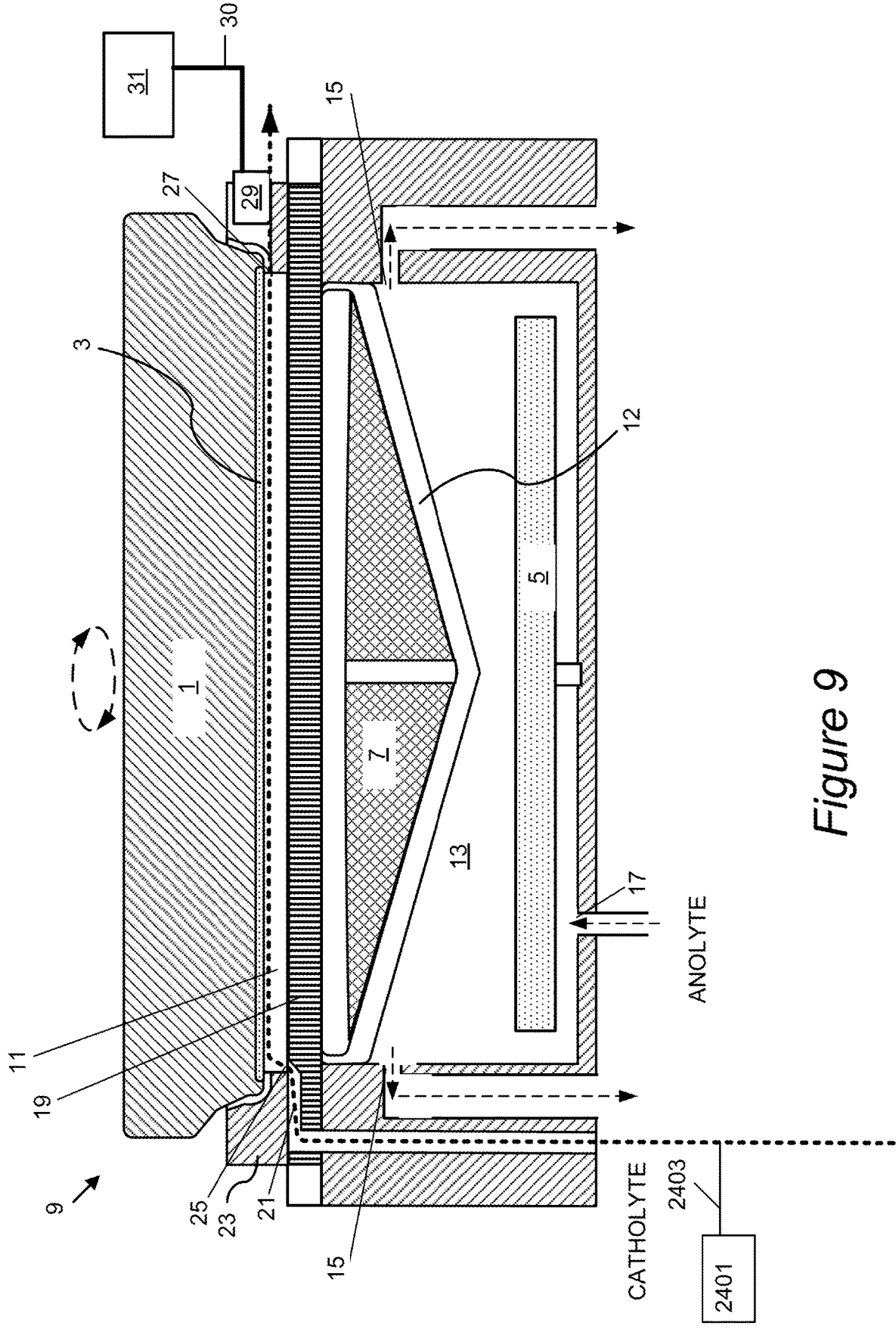
FIG. 9 is a schematic cross-sectional view of an electroplating apparatus according to an embodiment provided herein.

An example of a portion of an electroplating apparatus that includes a mechanism for transverse flow, a tailored ionically resistive ionically permeable element, and cathode and anode chambers is illustrated in FIG. 9. The apparatus includes a semiconductor substrate holder 1 configured to hold and optionally rotate the semiconductor substrate 3. A plurality of electrical contacts are made around the circumference of the substrate. The contacts are electrically connected to a power supply (not shown), that negatively (cathodically) biases the semiconductor substrate during the electrochemical electroplating. An anode 5 is positioned below the substrate 3 and is electrically connected to the power supply (not shown) that positively biases it during the electrochemical metal removal. Different types anodes can be used, including passive and active anodes. In some embodiment the anode is a soluble anode that includes the metal that is being plated.

A conically shaped membrane 7 is positioned between the anode 5 and the cathodic substrate 3 dividing the plating cell 9 into an anode chamber 11 and a cathode chamber 13. The membrane 7 is mounted on a frame 12 such that the vertex of the cone is closer to the anode than the base of the cone. The membrane is made of an ion-permeable material, such as an ion-permeable polymer. The anode chamber includes an inlet 17 and an outlet 15 for the anolyte.

The cathode chamber 13 is located above the membrane 7 and houses the cathodically biased substrate 3. In the depicted embodiment, a tailored ionically resistive ionically permeable element 19 (the "element") is positioned in the cathode chamber between the membrane 7 and the substrate holder 1. The ionically resistive ionically permeable element's working surface is preferably substantially coextensive with the working surface of the substrate and is located in close proximity to the substrate's working surface during electroplating. The element has a substrate-facing surface and an opposing surface, and is located such that the closest distance between the substrate-facing surface to the working surface of the substrate during the electrochemical metal removal is in some embodiments about 10 mm or less. In the illustrated embodiment the substrate-facing surface of the element is planar, but in other embodiments, the element may include one or more protrusions on the substrate-facing surface or the opposing surface of the element. The tailored element is made of a dielectric material having pores, and has been previously described. The element introduces a substantial resistance on the path of ionic current in the system and may be useful for reducing radial non-uniformity that can appear during electrodeposition due to a terminal effect, in addition to its function of providing a tailored ionic current environment on a die-level as described herein. Terminal effect can manifest itself in increased plating of metal near the edges of the substrate, if the electrical contacts to the substrate are made at the substrate periphery, which is typically the case. The ionically resistive ionically permeable element can serve as a high ionic resistance plate for making field distribution more uniform and to reduce the described terminal effect, thereby improving radial uniformity in metal removal. In some embodiments the element further plays a role in shaping the flow of electrolyte in the vicinity of the substrate. It may serve as a flow resistive element defining the region of high electrolyte flow and confining the flow into the cross flow region. For example, it may serve to provide a narrow gap (e.g., 10 mm or less) between the substrate-facing surface of the element and the working surface of the substrate into which the electrolyte is laterally injected. This arrangement facilitates the transverse (lateral) flow of the electrolyte near the surface of the substrate. The electrolyte (catholyte) can be injected into the gap using a cross flow injection manifold 21 that is at least partially defined by a cavity in the element 19. The cross flow injection manifold is arc-shaped and is positioned proximate the periphery of the substrate. A cross flow confinement ring 23 is positioned proximate the periphery of the substrate at least partially between the element 19 and the substrate holder. The cross flow confinement ring 23 at least partially defines the side of the gap between the element and the substrate. The cathode chamber has an inlet to the gap 25 adapted to receive the catholyte from source of catholyte through, for example, the cross flow injection manifold, and an outlet to the gap 27 adapted for removing the catholyte from the gap. The inlet 25 and the outlet 27 are positioned proximate azimuthally opposing perimeter locations of the working surface of the substrate (and also proximate azimuthally opposing perimeter locations of the substrate holder and proximate azimuthally opposing perimeter locations of the element). The inlet 25 and the outlet 27 are adapted to generate the cross-flow of electrolyte in the gap and to create or maintain transverse flow of electrolyte near the working surface of the substrate during electrochemical metal removal. In some embodiments the ionically resistive ionically permeable element serves the dual purpose of shaping ionic current distribution proximate the substrate, and of restricting electrolyte flow to provide a defined space for transverse flow of the electrolyte near the substrate.

The apparatus may optionally include a reference electrode 29, configured to measure potential proximate the substrate. The power supply, reference electrode and other elements of the apparatus are in electrical communication with a controller 31, which has a processor and a memory, and has program instructions for controlling the operation of the apparatus. For example, an electrical connection 30 can connect the reference electrode 29 with the controller 31. The controller may include program instructions for performing any of the methods described herein.

The cross-flow of catholyte in the gap between the element and the substrate can be generated using a variety of methods. In some embodiments, a flow confining element configured to restrict the flow in the gap to a transverse flow is provided. The apparatus in some embodiments is configured to provide a transverse flow having a velocity of at least about 3 cm/second across the center of the substrate. In some embodiments it is preferable to provide a vigorous transverse flow with a transverse flow rate of at least 10 cm/second, such as between about 10-90 cm/second or between about 20-80 cm/second across the center point of the substrate. Such relatively high transverse flow rates can be achieved for example using lateral injection of electrolyte into a gap proximate the substrate or by using reciprocating paddle movement.

In different implementations, the transverse flow may be generated using one or more of the following mechanisms: (1) a lateral electrolyte flow injector; (2) a flow diverter configured to divert electrolyte flow to a transverse flow; (3) an ionically resistive ionically permeable element having variation from uniformity in number, orientation and distribution of holes at or near the center of the rotating substrate, such as an element in which at least some of the holes proximate to the center of the rotating work piece have an angle deviating from vertical (more generally, an angle that is not perpendicular to the plating face of the rotating substrate), (4) a mechanism for generating a lateral component of relative motion between the work piece surface and the ionically resistive ionically permeable element (e.g., a relative linear or orbital motion), (5) one or more reciprocating or rotating paddles or a plate with a number of paddles or fan blades that force fluid to move at least partially transverse to the wafer as the plate is moved (e.g., a paddlewheel or impeller) provided in the plating cell, and (6) a rotating assembly attached to or proximate to the flow shaping plate and offset from the axis of rotation of the work piece. The apparatus in some embodiments includes a wafer holder that is part of the module/processing station, where the wafer holder stays in the module and/or processing station but can optionally rotate and move up and down within the processing station or module, e.g. the wafer holder can have a clam-shell design. In another embodiment the wafer holder can be removable from the processing station and travel through the tool with the wafer that it holds, forming a seal and releasing the wafer from the carrier elsewhere than at the metal removal processing station.

Figure 10:
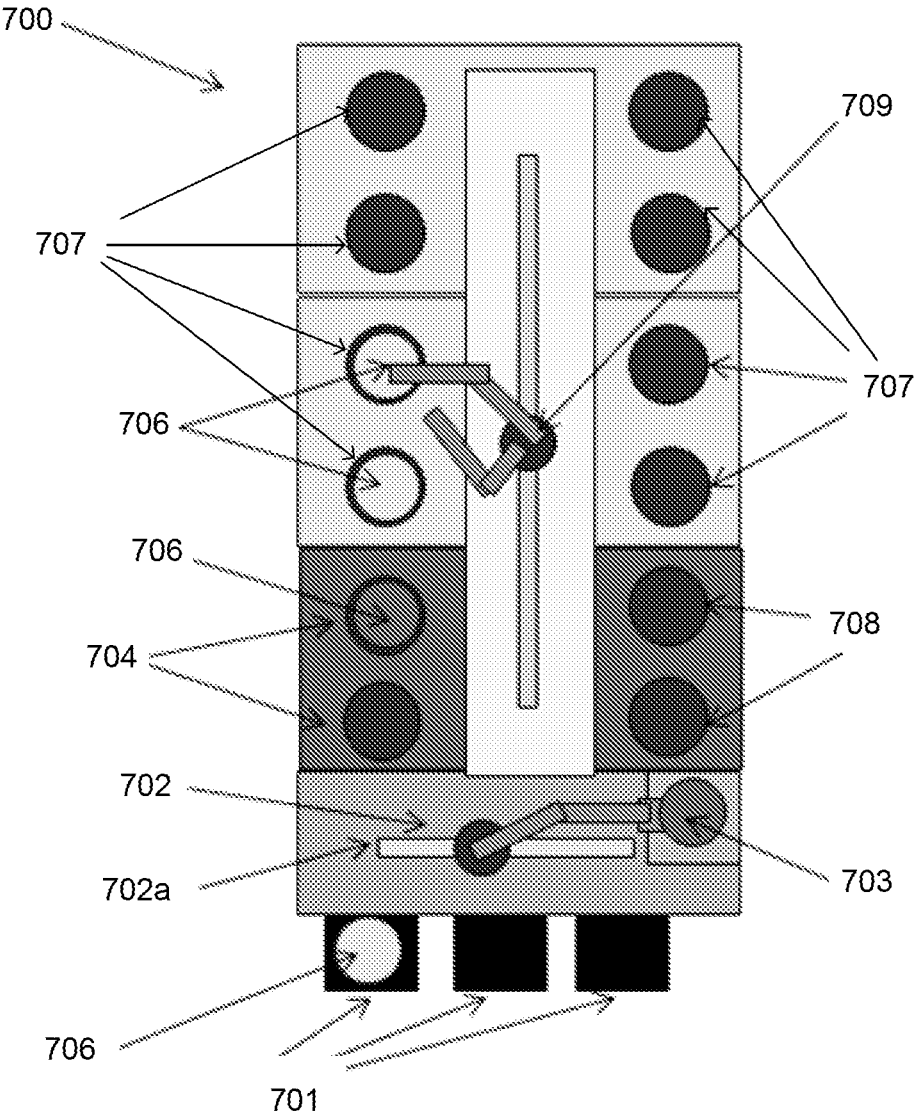
FIG. 10 is a schematic top view of a system that includes an electroplating apparatus according to an embodiment provided herein.

An integrated apparatus configured for electrodeposition is illustrated in FIG. 10. In this embodiment, the apparatus 700 has a set of electroplating cells 707, each containing an electrolyte-containing bath, in a paired or multiple "duet" configuration. In addition to electroplating per se, the apparatus 700 may perform a variety of other electroplating or electroplanarization related processes and sub-steps, such as spin-rinsing, spin-drying, metal and silicon wet etching, electroless deposition, pre-wetting and pre-chemical treating, reducing, annealing, photoresist stripping, and surface pre-activation, for example. The apparatus 700 is shown schematically looking top down in FIG. 10, and only a single level or "floor" is revealed in the figure, but it is to be readily understood by one having ordinary skill in the art that such an apparatus, e.g. the Lam Research Sabre™ 3D tool, can have two or more levels "stacked" on top of each other, each potentially having identical or different types of processing stations. In some embodiments electroplating stations for different metals are arranged on different levels of the tool. In other embodiments a single level may include stations for electroplating several metals.

Referring once again to FIG. 10, the substrates 706 that are to be electroplated are generally fed to the apparatus 700 through a front end loading FOUP (front loading unified pod) 701 and, in this example, are brought from the FOUP to the main substrate processing area of the apparatus 700 via a front-end robot 702 that can retract and move a substrate 706 driven by a spindle 703 in multiple dimensions from one station to another of the accessible stations—two front-end accessible stations 704 and also two front-end accessible stations 708 are shown in this example. The front-end accessible stations 704 and 708 may include, for example, pre-treatment stations, and spin rinse drying (SRD) stations. Lateral movement from side-to-side of the front-end robot 702 is accomplished utilizing robot track 702*a*. Each of the substrates 706 may be held by a cup/cone assembly (not shown) driven by a spindle connected to a motor (not shown), and the motor may be attached to a mounting bracket 709. Also shown in this example are the four "duets" of electroplating cells 707, for a total of eight cells 707. The electroplating cells 707 may be used for electroplating as described herein. A system controller (not shown) may be coupled to the electrodeposition apparatus 700 to control some or all of the properties of the electrodeposition apparatus 700. The system controller may be programmed or otherwise configured to execute instructions according to processes described earlier herein.

The system controller will typically include one or more memory devices and one or more processors configured to execute the instructions so that the apparatus will perform a method in accordance with the present invention. Machine-readable media containing instructions for controlling process operations in accordance with the present invention may be coupled to the system controller.

In some implementations, a controller is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of electrolytes, temperature settings (e.g., heating and/or cooling), voltage delivered to the cathode, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE)

chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Patterning Method/Apparatus:

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV, or extreme UV (eUV), or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

The invention claimed is:

1. An electroplating apparatus comprising:
   (a) a plating chamber configured to contain an electrolyte and an anode while electroplating metal onto a semiconductor substrate;
   (b) a substrate holder configured to hold the semiconductor substrate such that a plating face of the substrate is separated from the anode during electroplating; and
   (c) an ionically resistive ionically permeable element comprising a substrate-facing surface and an opposing surface, wherein the element allows for flow of ionic current through the element towards the substrate during electroplating, wherein the element comprises a plurality of regions, each region having a pattern of varied local resistance, and wherein the pattern of varied local resistance repeats in at least two regions.

2. The electroplating apparatus of claim 1, wherein each of the at least two regions has a length of at least about 5 mm.

3. The electroplating apparatus of claim 1, wherein each of the at least two regions has a length of between about 5-50 mm.

4. The electroplating apparatus of claim 1, wherein the ionically resistive ionically permeable element comprises at least five regions with repeating pattern of varied local resistance.

5. The electroplating apparatus of claim 1, wherein each region has a pattern with varied local porosity.

6. The electroplating apparatus of claim 5, wherein the ionically resistive ionically permeable element comprises non-communicating through-channels, and wherein the pattern of varied local porosity comprises a pattern of channels with different diameters.

7. The electroplating apparatus of claim 6, wherein at least some of the channels have a varying diameter such that the at least some channels have smaller diameter on a first surface of the ionically resistive ionically permeable element than on a surface opposing the first surface.

8. The electroplating apparatus of claim 5, wherein the ionically resistive ionically permeable element comprises non-communicating through-channels, and wherein the pattern of varied local porosity comprises a pattern of angled channels having different length.

9. The electroplating apparatus of claim 5, wherein the ionically resistive ionically permeable element comprises non-communicating through-channels, and wherein the pattern of varied local porosity comprises a pattern of helical channels having different length.

10. The electroplating apparatus of claim 1, wherein the ionically resistive ionically permeable element comprises non-communicating through-channels, and wherein the pattern of varied local resistance comprises a pattern of channels having different length.

11. The electroplating apparatus of claim 1, wherein the ionically resistive ionically permeable element is a plate having a plurality of through-channels, wherein channel diameters at the substrate-facing surface of the ionically resistive ionically permeable element are less than about 2 mm.

12. The electroplating apparatus of claim 1, wherein the ionically resistive ionically permeable element is positioned such that a distance from the substrate-facing surface of the ionically resistive ionically permeable element to the plating face of the semiconductor substrate is 10 mm or less.

13. An electroplating apparatus comprising:
   (a) a plating chamber configured to contain an electrolyte and an anode while electroplating metal onto a semiconductor substrate;
   (b) a substrate holder configured to hold the semiconductor substrate such that a plating face of the substrate is separated from the anode during electroplating; and
   (c) a shield positioned within about 10 mm of the plating face of the semiconductor substrate, wherein the shield has a grid-like shape with a plurality of regions, each region comprising at least one opening, wherein each region has a pattern of varied local resistance, and wherein the pattern of varied local resistance repeats in at least two regions.

14. The apparatus of claim 13, wherein the shield is configured to be moved during electroplating such as to agitate the electrolyte near the plating surface of the semiconductor substrate.

15. The apparatus of claim 14, wherein the shield comprises one or more protrusions and/or has variable thickness configured to facilitate agitation of the electrolyte during shield movement.

16. The electroplating apparatus of claim 1, wherein the apparatus is further configured to generate a lateral flow of electrolyte in a direction parallel to the plating face of the semiconductor substrate.

17. The electroplating apparatus of claim 1, further comprising a uniform ionically resistive ionically permeable element stacked with the ionically resistive ionically permeable element of claim 1.

18. An ionically resistive ionically permeable element, wherein the element is configured to allow for flow of ionic current through the element towards a substrate during electroplating, wherein the element comprises a plurality of regions, each region having a pattern of varied local resistance, and wherein the pattern of varied local resistance repeats in at least two regions.

19. The ionically resistive ionically permeable element of claim 18, wherein each of the at least two regions has a length of at least about 5 mm.

20. The ionically resistive ionically permeable element of claim 18, wherein each of the at least two regions has a length of between about 5-50 mm.

21. The ionically resistive ionically permeable element of claim 18, wherein each region has a pattern with varied local porosity.

22. The ionically resistive ionically permeable element of claim 21, wherein the ionically resistive ionically permeable element comprises non-communicating through-channels, and wherein the pattern of varied local porosity comprises a pattern of channels with different diameters.

23. The ionically resistive ionically permeable element of claim 22, wherein the ionically resistive ionically permeable element comprises channels having a smaller diameter on one side of the ionically resistive element than on an opposing side.

24. The ionically resistive ionically permeable element of claim 21, wherein the ionically resistive ionically permeable element comprises non-communicating through-channels, and wherein the pattern of varied local porosity comprises a pattern of angled channels having different length.

25. A method of electrodepositing a metal onto a semiconductor substrate, the method comprising:

(a) providing a semiconductor substrate having a pattern of features into an electroplating apparatus, wherein the electroplating apparatus comprises an ionically resistive ionically permeable element or a grid-like shield having a plurality of openings, wherein the ionically resistive ionically permeable element or the grid-like shield is positioned within about 10 mm of a plating face of the semiconductor substrate, and wherein the ionically resistive ionically permeable element or the grid like shield comprise a pattern correlating to the pattern of features of the semiconductor substrate;

(b) registering orientation of the semiconductor substrate with the ionically resistive element or the grid-like shield such that the pattern of the features on the semiconductor substrate and the matching pattern of the ionically resistive element or the grid-like shield are spatially aligned; and (c) electroplating metal onto the semiconductor substrate, while maintaining the semiconductor substrate stationary or spatially aligned relative to the ionically resistive element or the grid-like shield at least during a portion of a total electroplating time.

26. The method of claim 25, wherein the features on the semiconductor substrate are through-mask features, and wherein isolated regions of through-mask features are matched with more resistive portions of the ionically resistive ionically permeable element or are more shielded by the grid-like shield than denser regions of through-mask features.

27. The method of claim 25, wherein the semiconductor substrate remains stationary or spatially aligned relative to the ionically resistive element or the grid-like shield for at least 10% of the total electroplating time.

28. The method of claim 25, wherein the method comprises providing a lateral flow of electrolyte parallel to the semiconductor substrate during electroplating.

29. The method of claim 28, wherein (c) comprises electroplating metal onto the semiconductor substrate, wherein the semiconductor substrate remains stationary or spatially aligned relative to the ionically resistive element or the grid-like shield during the total electroplating time.

30. The method of claim 28, wherein (c) comprises electroplating metal onto the semiconductor substrate, such that the semiconductor substrate remains stationary or spatially aligned relative to the ionically resistive element or the grid-like shield during about 30-90% of the total electroplating time and such that the semiconductor substrate is rotated relative to the ionically resistive element or the grid-like shield during about the remainder of the total electroplating time.

31. The method of claim 28, wherein (c) comprises electroplating metal onto the semiconductor substrate, such that the semiconductor substrate remains spatially aligned relative to the ionically resistive element or the grid-like shield during about 30-90% of the total electroplating time and such that the semiconductor substrate is rotated relative to the ionically resistive element or the grid-like shield for the remaining time of the total electroplating time, wherein the ionically resistive ionically permeable element or the grid-like shield is moved with respect to the semiconductor substrate in at least one of rotational and lateral translational movement.

32. The method of claim 28, wherein the semiconductor substrate has a symmetrical pattern of features and wherein (c) comprises: (i) electroplating metal onto the semiconductor substrate, such that the semiconductor substrate remains stationary or spatially aligned relative to the ionically resistive element or the grid-like shield during a portion of the total electroplating time; (ii) rotating the substrate relative to the ionically resistive element or the grid-like shield by 180 degrees; and (iii) continuing electroplating in a new orientation.

33. The method of claim 32, further comprising repeating (i)-(iii) at least once.

34. The method of claim 28, wherein the semiconductor substrate has a symmetrical pattern of features and wherein (c) comprises: (i) electroplating metal onto the semiconductor substrate, such that the semiconductor substrate remains stationary or spatially aligned relative to the ionically resistive element or the grid-like shield during a portion of the total electroplating time; (ii) rotating the substrate relative to the ionically resistive element or the grid-like shield by 90 degrees; and (iii) continuing electroplating in a new orientation.

35. The method of claim 28, wherein (c) comprises electroplating metal onto the semiconductor substrate, such that the semiconductor substrate remains stationary or spatially aligned relative to the ionically resistive ionically permeable element or the grid-like shield during a portion of the total electroplating time in a first electroplating cell; and electroplating metal onto the semiconductor substrate, such that the semiconductor substrate remains stationary or spatially aligned relative to a second ionically resistive ionically permeable element or a second grid-like shield during a portion of the total electroplating time in a second electroplating cell, wherein both in the first cell and the second cell matching and registration for the semiconductor substrate feature pattern is retained, but wherein a direction of lateral flow in the second cell is opposite relative to the features of the semiconductor substrate from the first cell.

36. The method of claim 28, wherein (c) comprises electroplating metal onto the semiconductor substrate, such that the semiconductor substrate remains stationary or spatially aligned relative to the ionically resistive ionically permeable element or the grid-like shield during a portion of the total electroplating time in a first electroplating cell; and electroplating metal onto the semiconductor substrate, such that the semiconductor substrate remains stationary or spatially aligned relative to a second ionically resistive ionically permeable element or a second grid-like shield during a portion of the total electroplating time in a second electroplating cell, wherein both in the first cell and the second cell matching and registration for the semiconductor substrate feature pattern is retained, but wherein a direction of lateral flow in the second cell is different relative to the features of the semiconductor substrate from the first cell; and continue transferring the semiconductor substrate consecutively to multiple electroplating cells and electroplating in multiple electroplating cells, wherein a direction of lateral flow in the cells relative to the features of the semiconductor substrate is different.

37. The method of claim 28, wherein (c) comprises varying a direction of lateral electrolyte flow during electroplating.

38. The method of claim 25, further comprising:
applying photoresist to the semiconductor substrate;
exposing the photoresist to light;
patterning the photoresist and transferring the pattern to the semiconductor substrate; and
selectively removing the photoresist from the semiconductor substrate.

* * * * *